United States Patent
Hongo

(10) Patent No.: US 7,898,344 B2
(45) Date of Patent: Mar. 1, 2011

(54) PHASE-LOCKED OSCILLATOR AND MULTI-RADAR SYSTEM USING SAME

(75) Inventor: Hironobu Hongo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 101 days.

(21) Appl. No.: 11/898,156

(22) Filed: Sep. 10, 2007

(65) Prior Publication Data

US 2008/0061891 A1    Mar. 13, 2008

(30) Foreign Application Priority Data

Sep. 12, 2006 (JP) ................................. 2006-247416
Jun. 4, 2007 (JP) ................................. 2007-148188

(51) Int. Cl.
*H03L 7/00* (2006.01)

(52) U.S. Cl. ............... 331/17; 331/1 R; 331/16; 331/46; 331/47; 331/48; 327/156; 342/59; 342/103; 342/450; 342/463; 342/464; 342/465

(58) Field of Classification Search .................. 331/1 A, 331/10, 14, 16, 17, 18, 25, 156, 175, 176, 331/177 R, 179; 342/59, 70, 73, 81–83, 342/98, 102, 103, 111, 115, 122, 158, 423, 342/450, 463–465

See application file for complete search history.

(56) References Cited

U.S. PATENT DOCUMENTS

| | | | | |
|---|---|---|---|---|
| 5,334,952 A | * | 8/1994 | Maddy et al. | 331/1 A |
| 5,345,470 A | * | 9/1994 | Alexander | 375/144 |
| 5,382,922 A | * | 1/1995 | Gersbach et al. | 331/1 A |
| 5,495,255 A | * | 2/1996 | Komatsu et al. | 342/175 |
| 5,677,695 A | * | 10/1997 | Suzuki et al. | 342/109 |
| 6,087,980 A | * | 7/2000 | Saryo | 342/128 |
| 6,091,304 A | * | 7/2000 | Harrer | 331/10 |
| 6,175,282 B1 | | 1/2001 | Yasuda | |
| 6,339,395 B1 | * | 1/2002 | Hazumi et al. | 342/196 |
| 6,345,079 B1 | * | 2/2002 | Ohishi | 375/373 |
| 6,838,951 B1 | * | 1/2005 | Nieri et al. | 331/177 V |
| 7,047,146 B2 | * | 5/2006 | Chuang et al. | 702/106 |
| 7,151,476 B2 | * | 12/2006 | Egri et al. | 342/25 R |
| 7,298,219 B2 | * | 11/2007 | Dosho et al. | 331/16 |
| 7,339,518 B2 | * | 3/2008 | Natsume et al. | 342/70 |
| 7,352,320 B2 | * | 4/2008 | Enomoto et al. | 342/70 |
| 2001/0027503 A1 | * | 10/2001 | Yamato et al. | 710/126 |
| 2005/0104665 A1 | | 5/2005 | Molnar et al. | |
| 2005/0156780 A1 | * | 7/2005 | Bonthron et al. | 342/107 |
| 2007/0029946 A1 | * | 2/2007 | Yu et al. | 315/291 |

FOREIGN PATENT DOCUMENTS

JP 06-120735 4/1994

OTHER PUBLICATIONS

European Search Report for EP07116073 (dated Nov. 20, 2008).

* cited by examiner

*Primary Examiner* — Arnold Kinkead
*Assistant Examiner* — Richard Tan
(74) *Attorney, Agent, or Firm* — Murphy & King, P.C.

(57) ABSTRACT

In a multi-radar system, configured comprising a plurality of radar units which generate and output signals the frequency of which increases and decreases periodically, each radar unit generates and outputs signals synchronized with a prescribed sync signal, such that the upper limit and lower limit of the periodically increasing and decreasing frequency is different for the signals of each radar unit, and moreover the timing of the upper limit and lower limit of the signals substantially coincide. By this means, the frequency intervals between signals can be reduced, and more channels can be set, without causing radio wave interference.

17 Claims, 33 Drawing Sheets

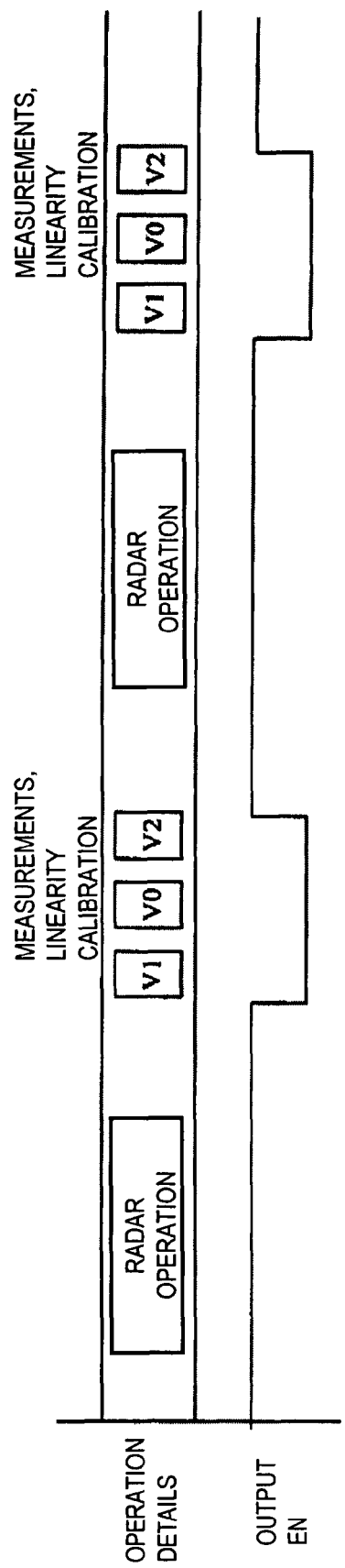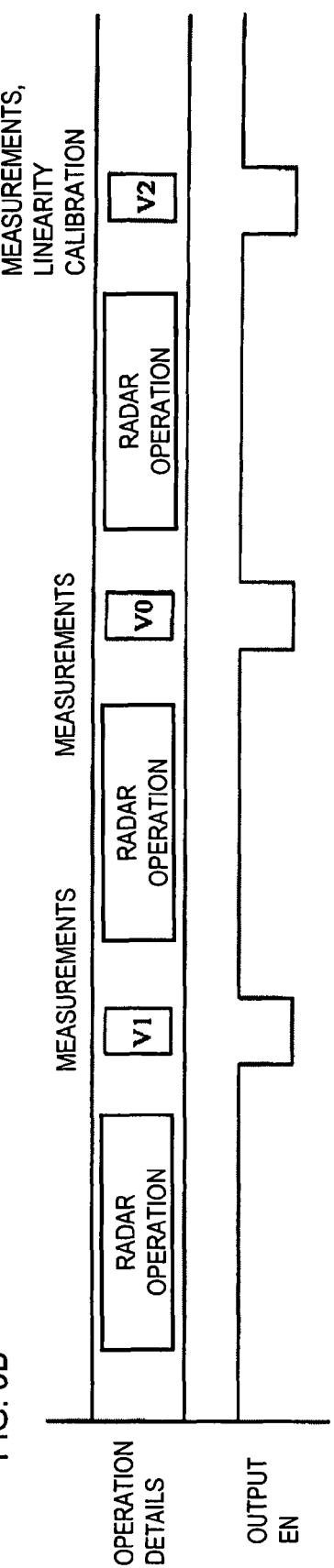
FIG. 8A
FIG. 8B

FIG. 16
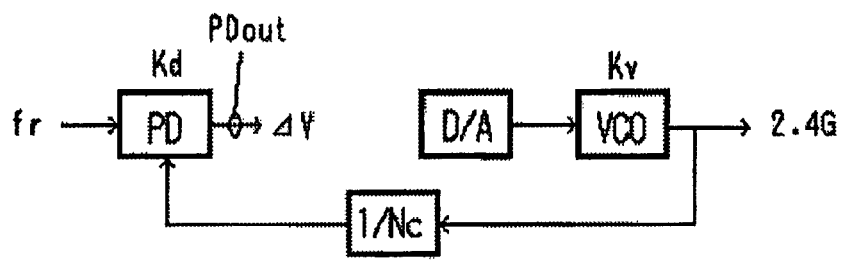
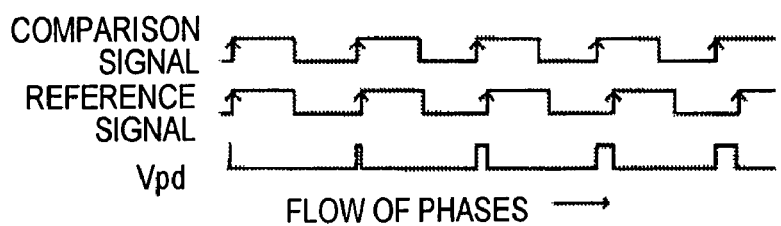
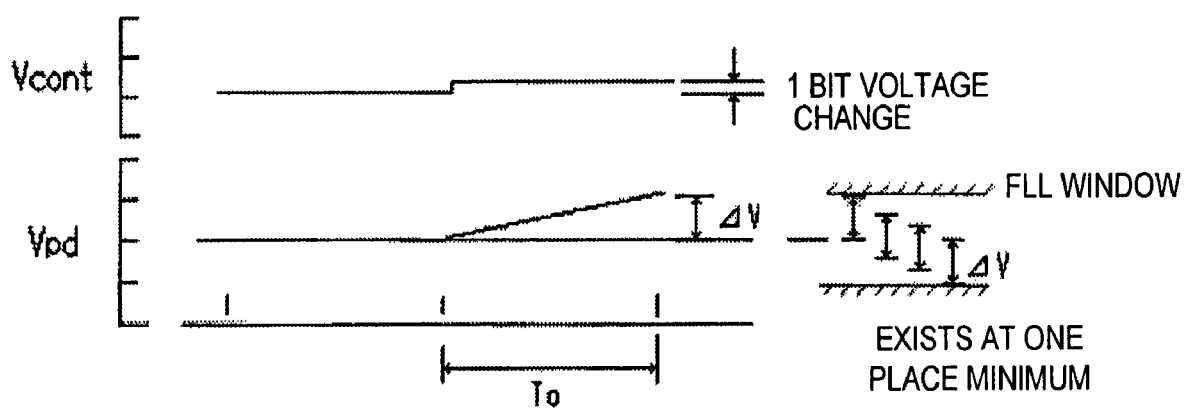

2-FREQUENCY CW METHOD

MALFUNCTION DETECTION USING Vpd

MALFUNCTION DETECTION USING V0

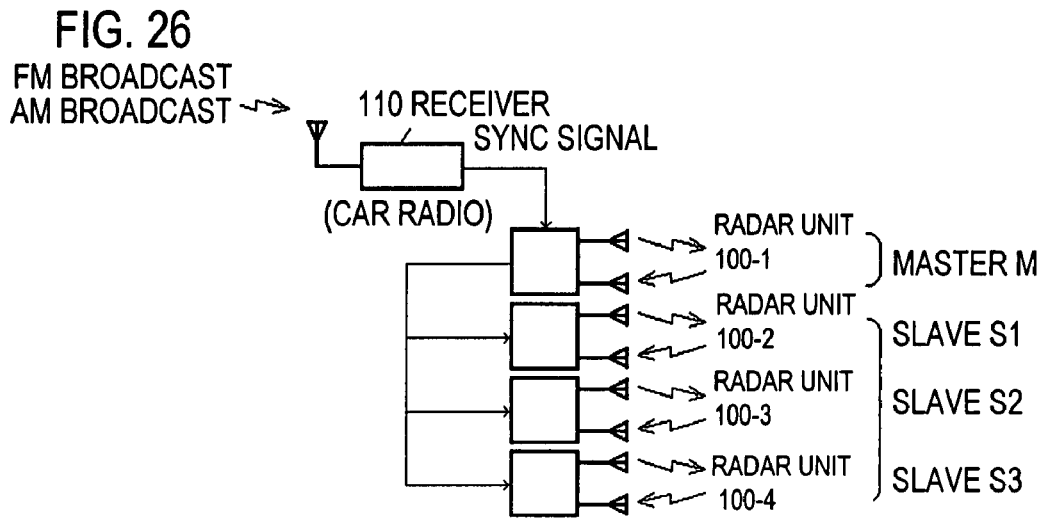

FIG. 30
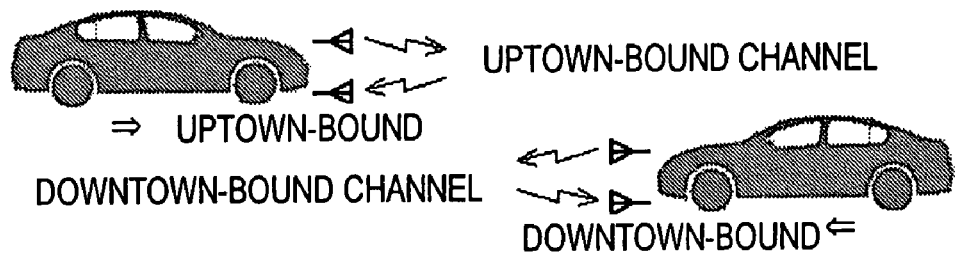
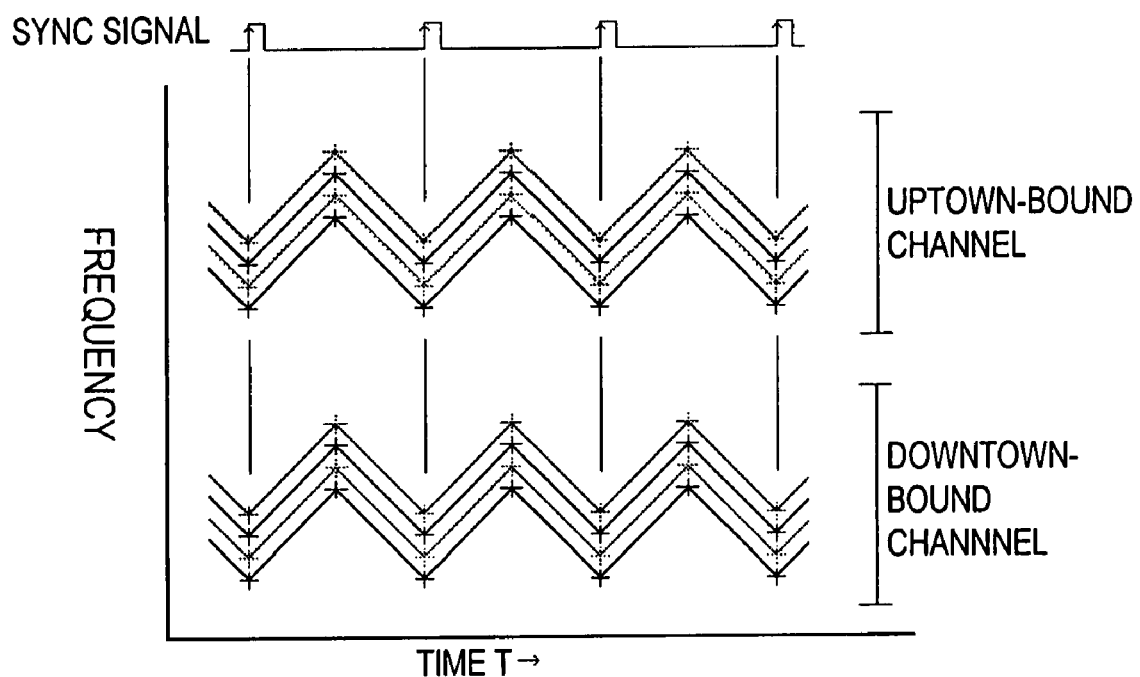

FIG. 31
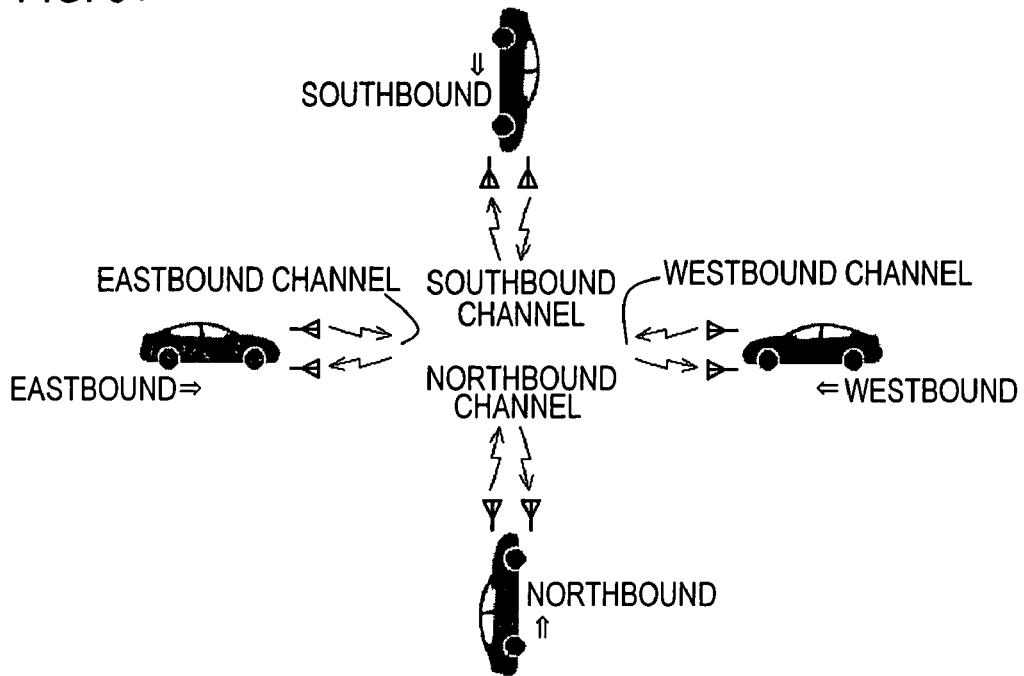
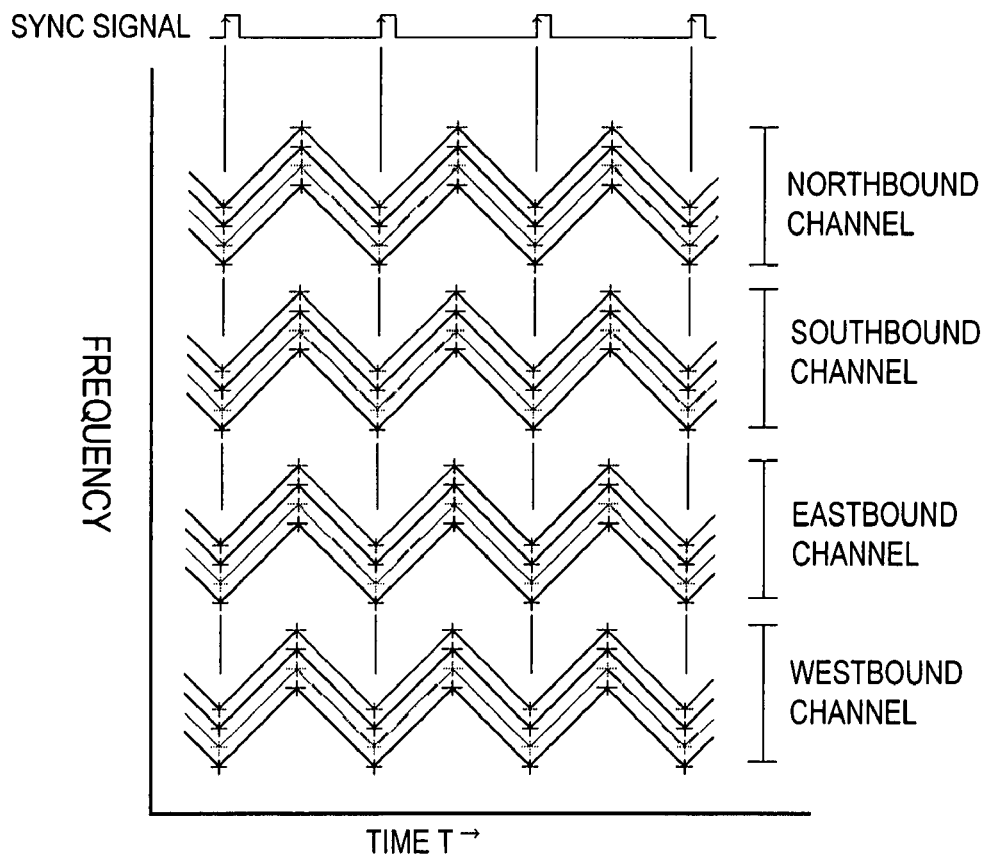

FREQUENCY DEVIATION DUE TO TEMPERATURE, HUMIDITY, INITIAL SETTINGS, AGING

FREQUENCY SHIFT SCATTERING

PHASE-LOCKED OSCILLATOR AND MULTI-RADAR SYSTEM USING SAME

CROSS-REFERENCE TO RELATED APPLICATIONS

This application is based upon and claims the benefit of priority from the prior Japanese Patent Application No. 2006-247416, filed on Sep. 12, 2006 and the prior Japanese Patent Application No. 2007-148188, filed on Jun. 4, 2007, the entire contents of which are incorporated herein by reference.

BACKGROUND OF THE INVENTION

1. Field of the Invention

This invention relates to a phase-locked oscillator and to a multi-radar system using the phase-locked oscillator. In particular, this invention is suitable for use in a phase-locked oscillator suitable for use in FM-CW radar or other RF-band oscillators, and for use in a multi-radar system using the phase-locked oscillator.

2. Description of the Related Art

FIG. 35A-35C are figures explaining technology of the prior art; FIG. 35A shows the frequency modulator of FM-CW radar of the prior art. In the basic configuration of the FM-CW method, a triangular-wave modulation signal is generated using a function generator (FG) or similar, and this modulation signal is used to apply frequency modulation to a voltage-controlled oscillator (VCO). Of importance in the FM-CW method is the application of precise triangular-wave frequency modulation; to this end, it is necessary, for example taking the center frequency as reference, that the maximum and minimum frequency deviation not change, and that the frequency change linearly with time, that is, that the slope thereof (rate of change of frequency) not change. The FM-CW radar output frequency depends on the stability of the VCO external conditions (temperature, power supply, and similar), and the frequency deviation of the output frequency depends on the VCO gain factor and output frequency, so that a VCO with high stability is necessary. Further, in order for the frequency to increase linearly, a VCO with good linearity is required.

FIG. 35B shows the typical configuration of an FM-CW radar transmitter of the prior art. To cope with changes with temperature in the oscillation frequency, the CPU uses the temperature detected by a temperature sensor to reference a data table, and corrects the center voltage of the triangular wave. With respect to linearity of the oscillation frequency, the CPU references the same data table to correct the triangular wave voltage.

FIG. 35C is a figure showing another configuration example of an FM-CW radar transmitter of the prior art, and shows a method of superposing a triangular wave in a PLL (Phase-Locked Loop) circuit. In this method, by phase-synchronizing the PLL with a center frequency, the center frequency is stabilized. On the other hand, with respect to the linearity of frequency deviation applied to this center frequency, a CPU corrects the triangular wave voltage by referencing a data table.

In the prior art, oscillation circuits are known in which, by using a triangular wave phase-synchronized with a crystal oscillator 6a as the modulation signal, the oscillation frequency is stabilized, and in addition, by frequency detection of the output RF signal, control is executed such that upper and lower limits of frequency deviation are not exceeded (Patent Reference 1).

Patent Reference 1: Japanese Patent Laid-open No. 6-120735

However, when a method is used to correct for temperature changes and linearity of the oscillation frequency using the above data table, not only is a separate large data table necessary, but it is necessary to prepare individual data tables for each device according to scattering in the circuit elements, and the number of testing processes is greatly increased. Further, in the configuration of the above FIG. 35C, because a PLL is used for feedback of the VCO output modulated by a triangular wave, the modulation characteristics of the VCO output are worsened. Also, the VCO modulation characteristics in Patent Reference 1 are assumed to be linear; if the characteristics are not linear, then a data table or similar must be used for linearity correction.

A multi-radar system comprises a plurality of individual arranged FM-CW radar units; by allocating each radar unit to a different detection area, a broader area can be detected with good precision. A multi-radar system may be a plurality of radar units installed in one device, or may be a plurality of devices with at least one radar unit installed. For example, when radar is installed in a vehicle such as an automobile, the radar installed in each vehicle forms a multi-radar system.

FIG. 36A-36B are figures explaining frequency allocation of each of the plurality of radar units in a multi-radar system of the prior art. FIG. 36A shows a case in which radio waves transmitted from radar units interfere; using the same frequency band, when triangular-wave modulated transmission signals are transmitted from a plurality of radar units, timing occurs in which transmission signals have the same frequency and it is impossible to determine from which radar unit a transmission signal was transmitted, so that accurate measurement becomes impossible. Consequently when a plurality of radar units are arranged, it is necessary to ensure that the frequencies of the signals transmitted from radar units do not mutually interfere, and so as shown in FIG. 36B, it is necessary to allocate to each radar unit at least a frequency band equal to the variation width of the frequency.

On the other hand, when the usable frequency band is limited, a broad frequency band cannot be allocated to a single radar unit. That is, the transmission signal frequency deviation cannot be made large. The larger the transmission signal frequency deviation, the higher is the sensitivity and resolution, and so when the allocated band is not sufficiently broad, the sensitivity and resolution are reduced.

Further, it is also necessary to leave a prescribed interval between adjacent transmission signals, taking into account changes in the center frequencies and frequency deviation of transmission signals due to changes in temperature, changes with aging, and similar. If these changes are large, then a large interval must be secured in order to prevent interference, and so the transmission signal frequency deviation magnitude or the number of radar units (number of channels) must be sacrificed.

FIG. 37A-37C are figures explaining changes in the center frequency and frequency deviation of transmission signals frequency-modulated by a triangular wave. FIG. 37A shows a case in which the center frequency of the transmission signals changes; FIG. 37B shows a case in which the transmission signal frequency deviation changes. FIG. 37C is a diagram showing an example of frequency allocation, taking frequency changes into account. In FIG. 37C, if in the 1 GHz band the frequency deviation is 200 MHz and the change is 50 MHz, then only two radar units can be positioned (only two channels can be secured), and the frequency band is not efficiently utilized.

SUMMARY OF THE INVENTION

This invention was devised in light of the above problems with the technology of the prior art, and has as an object the provision of a phase-locked oscillator from which highly stable VCO output can always be obtained through a simple configuration and under simple control, regardless of scattering in the characteristics of the VCO circuit and temperature fluctuations.

A further object of the invention is to provide a multi-radar system using a phase-locked oscillator from which highly stable VCO output can always be obtained, and which can more efficiently utilize a provided frequency band.

Means to Solve the Problem

The phase-locked oscillator of a first aspect (VCO calibration) of the invention is a phase-locked oscillator having a PLL loop, in turn having a phase detector, which compares a reference signal with the phase of a comparison signal; a low-pass filter, which integrates the phase error signal of the phase detector; a controller, interposed in a stage after the low-pass filter, which executes main control of the device; a VCO circuit, which generates a signal at a frequency according to a control voltage output from the controller; and a variable frequency divider, which frequency-divides the output signal of the VCO circuit and forms the comparison signal. The controller has control voltage measurement means for locking the PLL loop at a plurality of frequencies and for measuring the control voltage for each locking, and linearity calibration means for determining a VCO gain factor, representing the frequency change between intervals connecting each of the frequencies, based on each of the measured control voltages.

In this invention, by means of a configuration in which the PLL loop is locked on a plurality of frequencies, even when there is scattering or a temperature dependence of the VCO gain factor, a control voltage to cause oscillation of the VCO at the required frequency can be easily and accurately obtained.

The phase-locked oscillator of a second aspect (VCO driving) of the invention further has VCO driving means, after locking the PLL loop on a prescribed frequency, and with the PLL loop in the open state, for generating and outputting a voltage signal to cause a linearity-corrected frequency change centered on the prescribed frequency in the VCO circuit, based on the VCO gain factor thus determined.

In this invention, by means of a configuration which drives the VCO circuit using linearity-calibrated voltage signals, stabilized oscillation characteristics are always obtained, regardless of characteristic scattering or temperature fluctuations of the VCO circuit.

In a third aspect (intermittent PLL control) of the invention, the VCO driving means samples the output of the low-pass filter in synchronization with the timing of output of the center frequency by the VCO circuit, and when the detected phase error signal exceeds a prescribed range, offsets the control voltage in the direction to reduce the phase error signal. Hence by means of intermittent PLL control, a constant center frequency can be maintained.

The phase-locked oscillator of a fourth aspect (intermittent FLL control) of the invention has a first frequency divider which divides the frequency of a reference signal, and a second frequency divider which divides the frequency of the output of the VCO circuit and forms the comparison signal; the VCO driving means periodically resets the counters of the first and second frequency dividers with a period that is an integral multiple of the period of the signal applied to the VCO circuit, and, when the phase error signal of the low-pass filter output sampled in synchronization with the timing of the center frequency output by the VCO circuit exceeds a prescribed range, offsets the control voltage in the direction to reduce the phase error signal.

In this invention, by means of a configuration in which the counters of the first and second frequency dividers are periodically reset, the phases of the two frequency-divided signals are forcibly coordinated. However, if the frequency of the VCO output is shifted, the phase between the two frequency-divided signals rapidly increases. Hence in this invention, by periodically detecting the phase error signal of the low-pass filter output, the rate of change of the phase error signal is monitored, and shifting of the VCO output frequency is detected. In this invention, by periodically resetting the counters of the first and second frequency dividers, there is no pull-in to a particular absolute phase, and so phase pull-in is fast. In this specification, control which judges that the state is locked only when frequencies are coincident is called FLL (Frequency Locked Loop) control.

The phase-locked oscillator of a fifth aspect (PLL rapid pull-in) of the invention has a first variable frequency divider, which performs frequency division of a reference signal, and a second variable frequency divider, which performs frequency division of the VCO circuit output and forms the comparison signal; after setting a prescribed frequency division ratio to the first and second variable frequency dividers, the controller, upon forming the PLL loop and initiating phase pull-in between the reference signal and the comparison signal, applies a control voltage corresponding to the prescribed frequency division ratio to the VCO circuit, and resets the counters of the first and second variable frequency dividers.

In this invention, by applying a control voltage corresponding to the preset frequency division ratio to the VCO circuit from the start, a VCO output close to the required frequency is obtained from the start. Further, by resetting the counters of the first and second variable frequency dividers, the initial phases of both frequency-divided signals are forced to coincide. In this case, the frequencies of the frequency-divided signals already substantially coincide, and because the initial phases of both frequency-divided signals coincide, the PLL loop rapidly converges on the locked state.

The phase-locked oscillator of a sixth aspect (having a VCO circuit the VCO gain factor of which does not change with temperature) of the invention has a PLL loop, in turn having a phase detector, which compares the phases of a reference signal and a comparison signal; a low-pass filter, which integrates the phase error signal of the phase detector; a controller, interposed in a stage after the low-pass filter, which executes main control of the device; a VCO circuit, which generates a signal at a frequency according to a control voltage output from the controller; and a variable frequency divider, which frequency-divides the output signal of the VCO circuit and forms the comparison signal. The controller has control voltage measurement means for changing the PLL locked frequency at prescribed intervals and measuring the control voltage at each loop locking over a range covering a prescribed frequency range; linearity calibration means for determining a VCO gain factor, representing the frequency change representing each interval obtained by dividing into a plurality of intervals the range over which the measured control voltage changes; and VCO driving means, with the PLL loop in the open state after locking the PLL loop on a prescribed frequency, for generating and outputting a voltage signal to cause a linearity-corrected frequency change centered on the prescribed frequency in the VCO circuit, based on the control voltage when the loop is locked and the VCO gain factor representing each interval.

In this invention, if the VCO gain factor within a required frequency range is once determined in advance, then because the VCO gain factor does not much change with temperature, during VCO driving at an arbitrary temperature, with the PLL loop locked at a prescribed frequency and the PLL loop in the open state, the VCO driving means generates and outputs a voltage signal causing a linearity-corrected frequency change centered on the prescribed frequency in the VCO circuit, based on the control voltage at the time of locking (reference voltage) and the VCO gain factor presenting each interval thus determined; by this means, the VCO circuit can always be driven at the correct frequency regardless of temperature.

The multi-radar system of a seventh aspect of the invention is a multi-radar system having a plurality of FM-CW radar units having the phase-locked oscillator according to any one among the above first through sixth aspects of the invention; the controller of each FM-CW radar unit generates a control voltage, which increases and decreases periodically, and is synchronized with a prescribed sync signal such that the increase/decrease direction and the increase/decrease rate of the control voltages are coincident; and the VCO circuit of each FM-CW radar unit outputs a signal, according to the increase and decrease in the control voltage, with the prescribed frequency deviation with respect to a center frequency of the signal increasing and decreasing periodically such that the center frequencies are different for each signal and such that the direction of increase/decrease and the increase/decrease rate of the signals are coincident.

In this invention, the frequency intervals between signals can be decreased without causing radio wave interference, and a greater number of channels can be set.

The multi-radar system of an eighth aspect is that of the above seventh aspect, in which one among the controllers of the FM-CW radar units generates the sync signal, and outputs the signal to the remaining controllers.

The multi-radar system of a ninth aspect of the invention is that of the above seventh aspect, in which one among the above controllers of the FM-CW radar units receives a sync signal supplied from an external device, and outputs the signal to the remaining controllers.

The multi-radar system of a tenth aspect of the invention is that of the above seventh aspect, in which the controllers of each of the FM-CW radar units each receive a sync signal supplied from an external device.

The multi-radar system of an eleventh aspect of the invention is a multi-radar system having a plurality of radar units which generate and output signals the frequency of which increases and decreases periodically, characterized in that the upper limit and lower limit of the periodically increasing and decreasing frequency are different for the signals of each radar unit, and that radar units generate signals in synchronization with a prescribed sync signal, such that the timing with which the signals reaching the upper limits and lower limits substantially coincides.

The multi-radar system of a twelfth aspect of the invention is that of the above eleventh aspect, in which each radar unit generates the signal in synchronization with the prescribed sync signal such that the direction of increase/decrease and rate of increase/decrease of the signal frequency coincide.

The multi-radar system of a thirteenth aspect of the invention is that of the above eleventh aspect, in which one among the above plurality of radar units generates the sync signal, and outputs the signal to the remaining radar units.

The multi-radar system of a fourteenth aspect of the invention is that of the above eleventh aspect, in which one among the above plurality of radar units receives a sync signal supplied from an external device, and outputs the signal to the remaining radar units.

The multi-radar system of a fifteenth aspect of the invention is that of the above eleventh aspect, in which the above plurality of radar units receive a sync signal supplied from an external device.

The multi-radar system of a sixteenth aspect of the invention is that of the above eleventh aspect, in which the plurality of radar units are installed respectively on a plurality of vehicles, and radar units installed on vehicles advancing in a first direction generate signals at a frequency included in a first frequency band, and radar units installed on vehicles advancing in a second direction different from the first direction generate signals at a frequency included in a second frequency band different from the first frequency band.

Advantageous Effect of the Invention

As explained above, by means of a phase-locked oscillator of this invention, even when a VCO circuit having scattering in characteristics or changes with temperature is used, the output frequency due to PLL control can be stabilized, the linearity of output frequency changes due to VCO driving in a PLL open-loop state can be improved, and so the reliability of the phase-locked oscillator can be improved; moreover, the contribution to the spread of FM-CW radar unit and similar using such oscillators is exceedingly great.

Further, by means of a multi-radar system of this invention, even when the frequency deviation amount of channels allocated to the usable frequency band is approximately the same as in the prior art, the channel frequency intervals can be made narrower without causing radio wave interference, a larger number of channels can be set in the frequency band compared with the prior art, and the efficiency of frequency use can be greatly improved.

BRIEF DESCRIPTION OF THE DRAWINGS

FIG. 8A-8B are timing charts of radar working operation in the first aspect.

FIG. 16 is a diagram (2) explaining the phase-locked oscillator of the fifth aspect.

FIG. 26 shows in summary an example of the configuration of the multi-radar system of an eighth aspect.

FIG. 27 shows an example of the configuration of the oscillator 101 in each radar unit of the multi-radar system of a ninth aspect.

FIG. 30 shows an application example in which channel frequency bands are divided according to the direction of advance of a vehicle.

FIG. 31 shows another application example in which channel frequency bands are divided according to the direction of advance of a vehicle.

DETAILED DESCRIPTION OF THE PREFERRED EMBODIMENTS

Below, preferred aspects of the invention are explained in detail, referring to the attached drawings. Throughout all the drawings, the same symbols denote the same or equivalent portions.

(Phase-Locked Oscillator)

Figure 1:
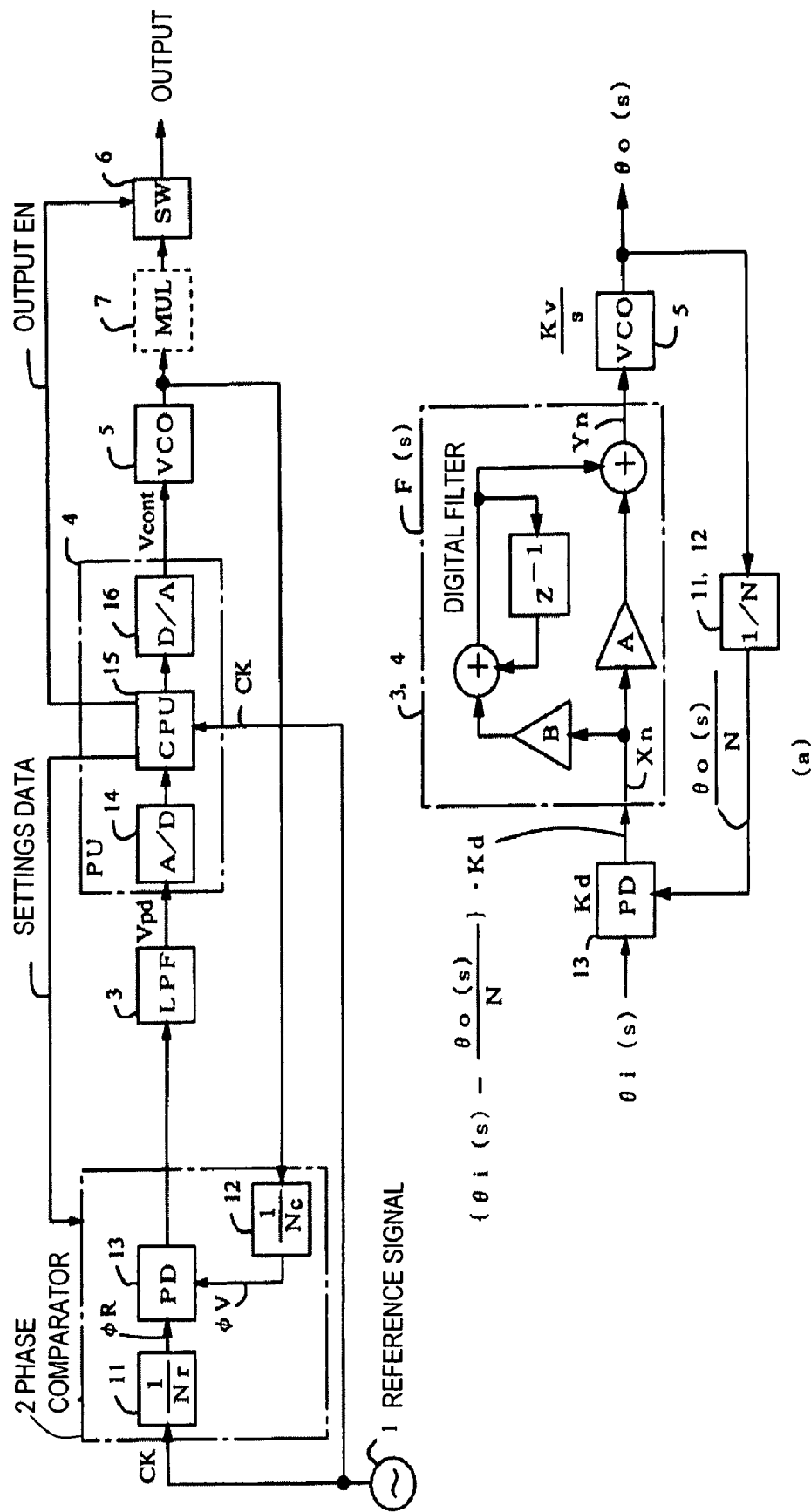
FIG. 1 is a block diagram of the phase-locked oscillator of a first aspect.

FIG. 1 is a block diagram of the phase-locked oscillator of a first aspect. In the figure, a reference number 1 is a clock oscillator which generates a PLL reference clock signal CK, a reference number 2 is a phase detector comprised by the PLL loop, a reference number 11 is a variable frequency divider for the clock signal CK, a reference number 12 is a VCO output variable frequency divider, a reference number 13 is a phase detector (PD) which compares the phases of the two frequency-divided outputs φR and φV, a reference number 3 is a low-pass filter (LPF) which integrates the phase error signal of the output of the PD 13, a reference number 4 is a processor unit (PU) which is equivalent to the controller of the invention, a reference number 14 is an A/D converter which samples the phase error signal Vpd of the output of the LPF 3, a reference number 15 is a CPU which performs main control and processing of the oscillator, a reference number 16 is a D/A converter which converts the control voltage of the output of the CPU 15 into an analog control voltage Vcont, a reference number 5 is a voltage controlled oscillator (VCO) which outputs an oscillation signal at a frequency corresponding to the control voltage Vcont, and a reference number 6 is an RF switch (SW) which passes or cuts off the output of the VCO 5.

The CPU 15 executes control to stabilize the oscillation frequency of the VCO 5 by forming a PLL loop either continuously or periodically, regardless of characteristic scattering or temperature fluctuations of the VCO 5, and executes control to generate a triangular wave signal in a state in which the PLL loop is open during radar operation to cause the VCO 5 to output a linearity-corrected frequency modulated output. Specifically, by executing the various processing shown in FIG. 2, FIG. 4 and FIG. 6 described below, the control voltage measurement means, linearity calibration means, VCO driving means (radar transmission processing), and various other functions of this invention can be realized.

The control voltage measurement means causes the PLL loop to be locked on a plurality of frequencies, and measures the control voltage Vcont at each loop locking. At this time, setting data is output to the phase detector 2, and the frequency dividing ratio of the variable frequency dividers 11, 12 is set to a desired value. Further, the phase error signal Vpd of the output of the LPF 5 is periodically sampled, and by means of well-known PLL processing, the control voltage Vcont is updated in the direction so as to reduce the phase error signal Vpd, and the PLL loop is locked in sequence on a plurality of frequencies. The control voltage Vcont acquired at each loop locking is the control voltage Vcont necessary to cause oscillation at each prescribed frequency of the VCO 5, regardless of the characteristic scattering and temperature changes of the VCO 5.

A conceptual diagram of the configuration of an example of a PLL loop appears in the inserted diagram A in FIG. 1. Here, the functions of a loop filter realized by LPF 3 and the CPU 15 are represented by a digital filter having a transfer function F(s). By configuring a digital filter using the CPU 15, the filter characteristics can be changed using the gain and clock period. If the digital filter input is X(n) and output is Y(n), then the differential equation is $$Y(n)=(A+B)\cdot X(n)+Y(n-1)-A\cdot X(n-1)$$

Converting to the variable Z results in $$Y(z)=(A+B)\cdot X(z)+z-1\cdot Y(z)-A\cdot z-1\cdot X(z)$$

The filter transfer function F(z) is represented by $$F(z)=Y(z)/X(z)=A+B/(1-Z-1)$$

Expressing this in terms of F(s) results in $$F(s)=A+B/(1-e-j2\pi fT)$$

Further, if the input phase is θi(s) and the output phase is θo(s) for the PLL, then the loop transfer function H(s) is expressed by $$H(s) = \theta o(s)/\theta i(s)$$
$$= K \cdot F(s)/\{s + K \cdot F(s)\}$$
Here $K = Kd \cdot Kv/N$ Next, the linearity calibration means determines the VCO gain factor so as to represent the change in frequency over intervals connecting each of the frequencies (for example, as a linear approximation), based on each of the control voltages Vcont measured. Then, the VCO driving (radar transmission) means locks the PLL loop on a prescribed frequency (for example, the transmission signal center frequency), and then, with the PLL loop in the open state, generates and outputs a voltage signal to cause a linearity-corrected frequency change centered on the prescribed frequency in the VCO circuit, based on the VCO gain factor thus determined. At the time of this radar transmission, because the loop control is left open, there is no loop feedback so as to suppress changes in the frequency of the VCO 5, and so frequency change with high fidelity can be maintained. Further, by executing intermittent loop control to stabilize the center frequency of radar transmission, for example at every period of the radar transmission, the radar transmission wave frequency can also be stabilized. Below, this control and processing are explained in detail.

Figure 2:
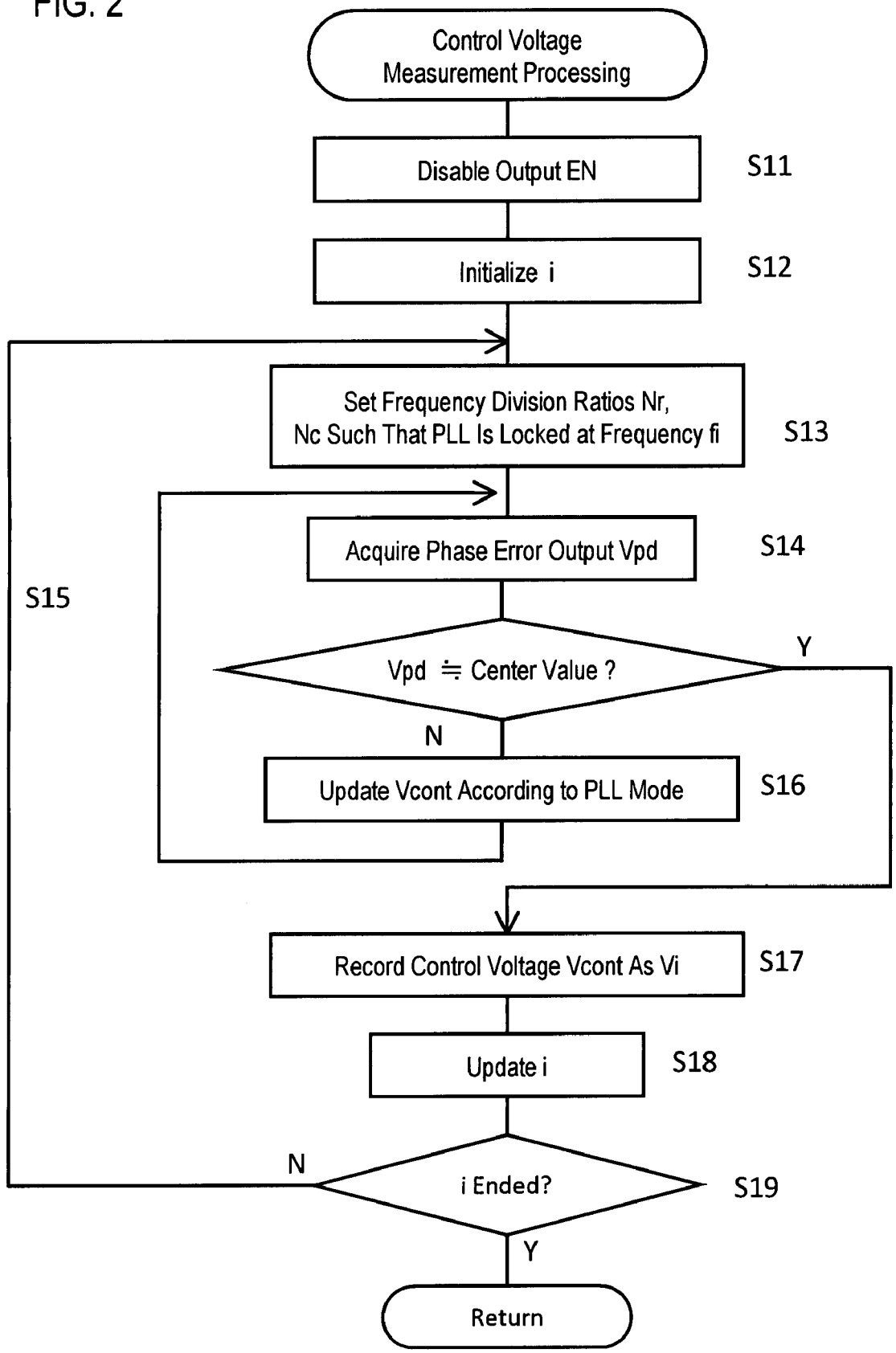
FIG. 2 is a flowchart of control voltage measurement processing in the first aspect.

FIG. 2 is a flowchart showing control voltage measurement processing in the aspect, showing a case in which, by changing the PLL frequency division ratio, each of the control voltages V0, V1, V2 to obtain the center frequency f0, lower-limit modulation frequency f1, and upper-limit modulation frequency f2 of the VCO output are measured. In step S11, the output EN of RF switch SW 6 is disabled so as not to output unnecessary waves during measurement of the control voltage Vcont, and radio wave (RF) output is shut off. In step S12, the contents of register i holding the measurement sequence are initialized (for example, to i=1). In step S13, the frequency division ratios Nr, Nc of the frequency dividers 11, 12 are set such that the PLL is locked on frequency fi (initially, the lower-limit frequency f1). By this means, the PD 13 outputs a phase error signal corresponding to the phase error of the two frequency-divided signals φR and φV, and this is integrated (filtered) by the LPF 3.

In step S14, the CPU 15 periodically acquires the phase error output Vpd of the output of the LPF 3, and in step S15 judges whether the signal Vpd is within a prescribed range centered on the required center value (for example, 2.5 V). If not in the prescribed range, the PLL loop is not in the locked state, and so processing proceeds to step S16, and the control voltage Vcont is updated such that Vpd approaches the center value according to the normal PLL mode.

When finally in the judgment of step S15 the phase error output Vpd≈center value, the PLL loop is in the locked state, and so processing proceeds to step S17, and the control voltage Vcont at this time is stored in memory as Vi (initially, control voltage V1 for the lower-limit frequency f1). In step S18, the contents of the register i are updated, and the next object for measurement is for example set to the center frequency f0. In step S19, a judgment is made as to whether measurements have been completed for the contents of register i, and if measurements have not been completed, processing returns to step S13. In this way, measurements are subsequently performed for the center frequency f0 (V0) and for the upper limit frequency f2 (V2), and when finally in the judgment of step S19 it is judged that measurements have been completed, the processing is ended.

Figure 3:
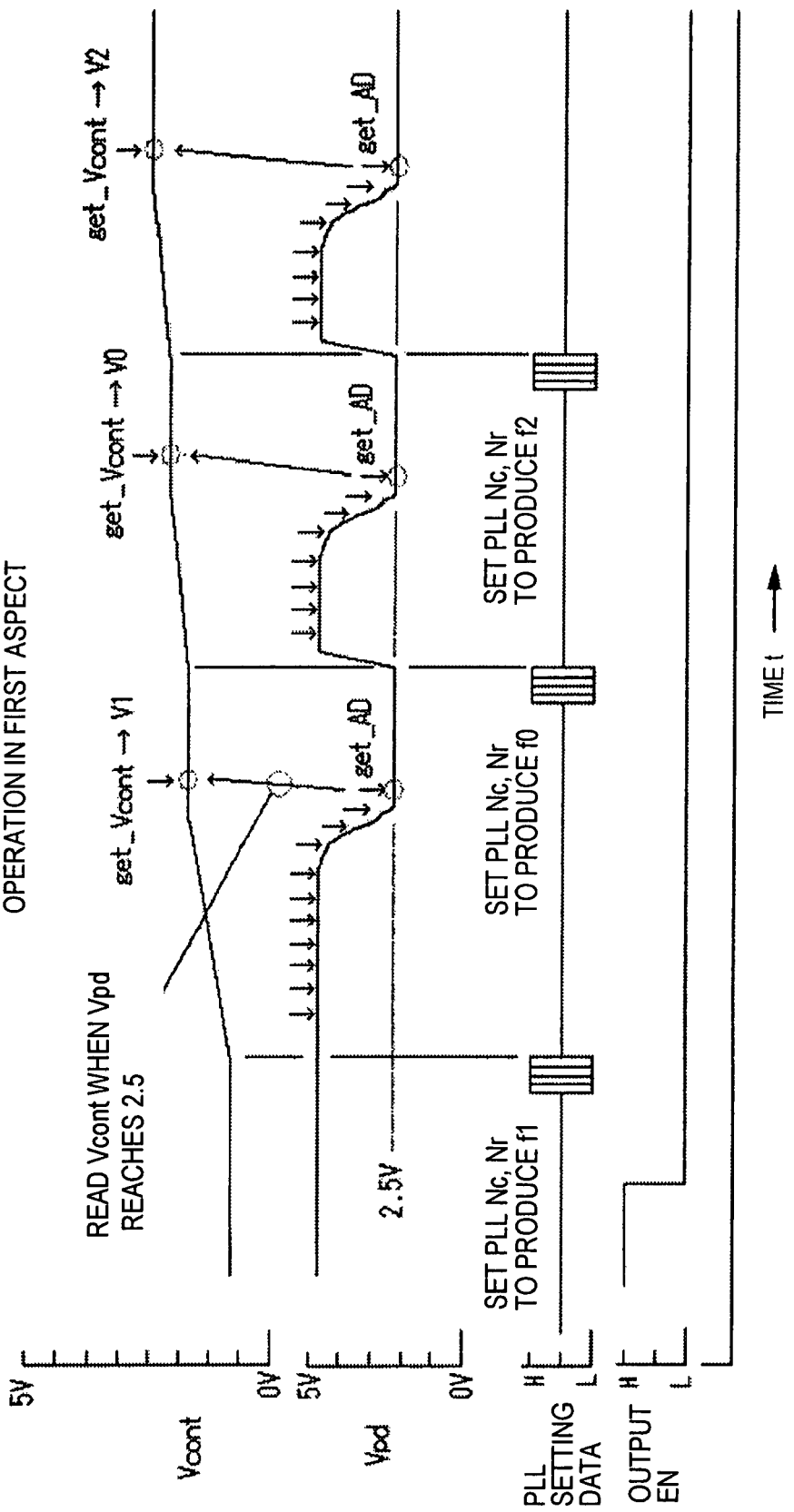
FIG. 3 is a timing chart of control voltage measurement operation in the first aspect.

FIG. 3 is a timing chart of the control voltage measurement operation of the first aspect. In one example, the phase error output Vpd changes between 0 and 5 V, and the locked state is judged in the vicinity of 2.5 V, near the center. Initially, the frequency division ratios Nr, Nc are set such that the PLL is locked at for example the lower limit frequency f1, and PLL loop control is performed over the prescribed time interval. The CPU 15 periodically acquires Vpd, and updates the control voltage Vcont in the direction such that the phase error output Vpd approaches 2.5 V, based on normal PLL loop control. In this way, loop control is continued, until finally, when Vpd≈2.5 V, the locked state is reached; at this time, the oscillation frequency f of the VCO 5 is accurately at the lower limit frequency f1, regardless of characteristic scattering of the VCO 5 or temperature. The CPU 15 acquires the control voltage Vcont at this time, and stores this in memory as the control voltage V1 to cause the lower limit frequency f1 of the VCO 5.

Next, the PLL is locked on the center frequency f0, and the Vcont at this time is stored in memory as the control voltage V0 to cause the VCO 5 to generate the center frequency f0. Finally, the PLL is locked on the upper limit frequency f2, and the Vcont at this time is stored in memory as the control voltage V2 to cause the VCO 5 to generate the upper limit frequency f2.

In this aspect, by locking the PLL loop on each of the prescribed frequencies (prescribed frequency division ratios) f0, f1, f2, the control voltages V0, V1, V2 to cause oscillation of VCO 5 at the prescribed frequencies f0, f1, f2, regardless of characteristic scattering or temperature changes of the VCO 5, can be determined accurately and automatically.

Figure 4:
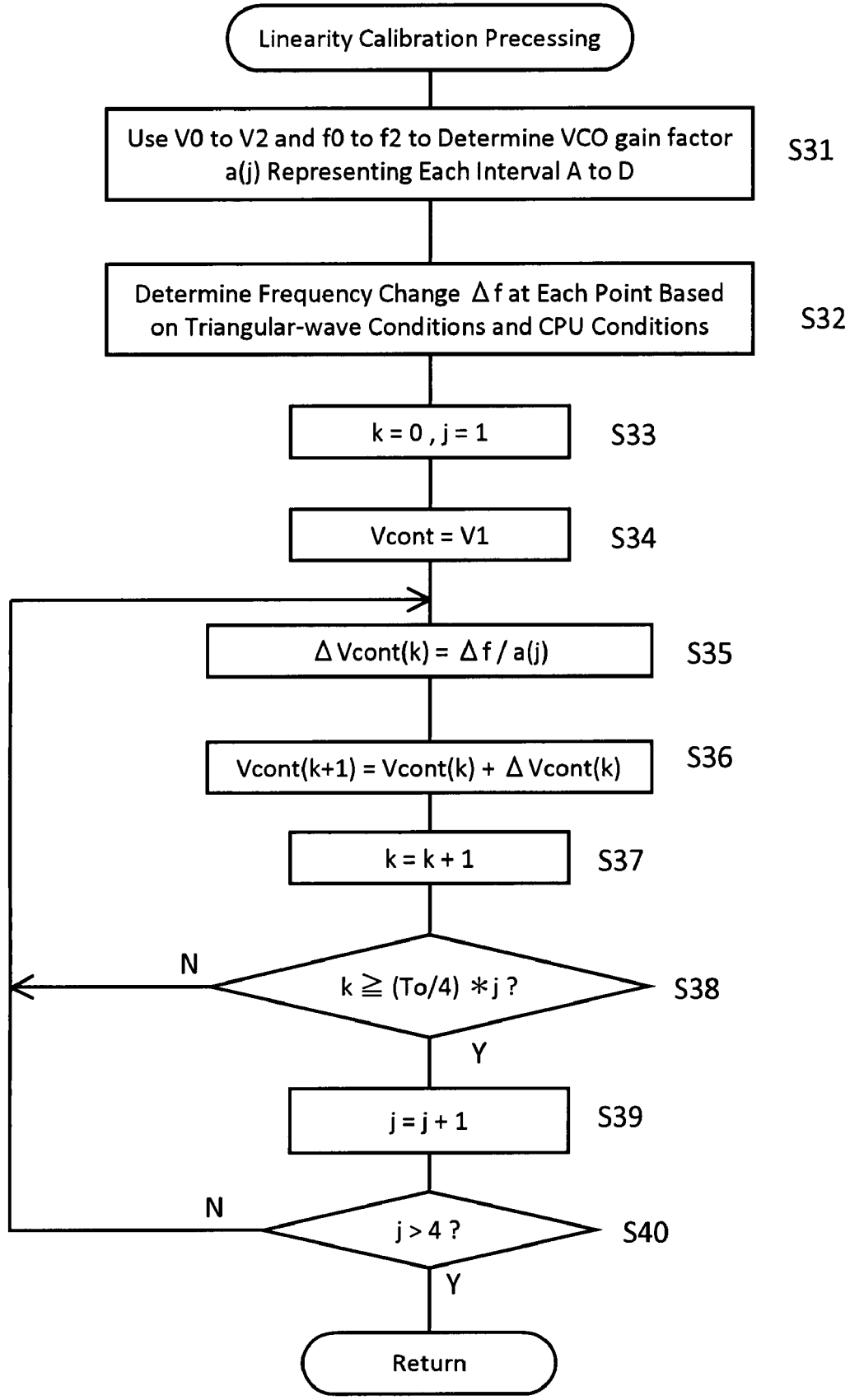
FIG. 4 is a flowchart of linearity calibration processing in the first aspect.
Figure 5:
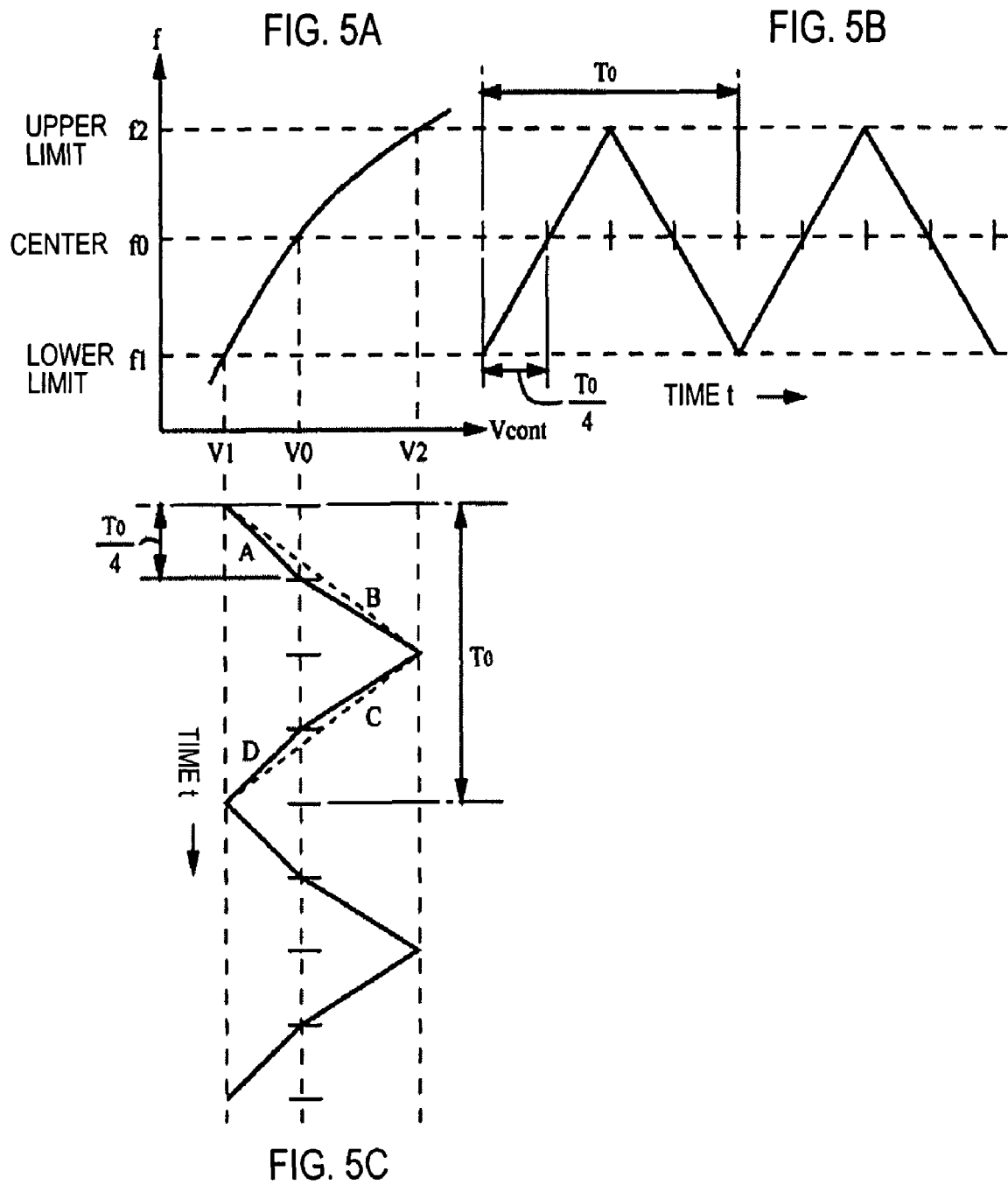
FIG. 5A-5C are timing charts of linearity calibration operation in the first aspect.

FIG. 4 is a flowchart of linearity calibration processing in the first aspect, showing processing, based on information for the combinations (f1,V1), (f0,V0) and (f2,V2) determined above, to determine control voltages Vcont to linearly change the VCO output over intervals connecting the frequencies A through D for each constant frequency Δf. If the control voltages Vcont determined in this processing are actually output to the VCO 5, the output frequency characteristic shown in FIG. 5B is obtained.

In step S31, the information of the control voltages V0 to V2 acquired in the processing of the above FIG. 2 and the frequencies f0 to f2 is used to linearly approximate the VCO gain factor of the VCO 5, using the characteristic a(j), over each interval j (=A to D) obtained by dividing the triangular wave period T0 into for example four portions. FIG. 5C shows the timing of linearity calibration operation.

From the frequency change f1→f0 and control voltage change V1→V0 in interval A,

VCO gain factor $aA=(f0-f1)/(V0-V1)$

From the frequency change f0→f2 and control voltage change V0→V2 in interval B,

VCO gain factor $aB=(f2-f0)/(V2-V0)$

From the frequency change f2→f0 and control voltage change V2→V0 in interval C,

VCO gain factor $aC=-(f2-f0)/(V2-V0)=-aB$

From the frequency change f0→f1 and control voltage change V0→V1 in interval D,

VCO gain factor $aD=-(f0-f1)/(V0-V1)=-aA$

In step S32, the frequency change Δf at each time (for example, a constant 0.5 MHz per 50 μs) is determined according to the triangular wave conditions (for example, triangular wave period=10 ms, frequency deviation from center frequency f0=±25 MHz) and CPU conditions (for example, time resolution of Vcont=50 μs, voltage resolution=0.005 V). In step S33, the timing counter is initialized to k=0 and the area register is initialized to j=A. In step S34, the control voltage Vcont is set to control voltage V1, for example, in order to generate the lower limit frequency f1.

In step S35, the increment ΔVcont(k) in the control voltage is determined from $$\Delta Vcont\ (k)=\Delta f/a(j)$$

In step S36, the control voltage at the next time Vcont(k+1) is determined from $$Vcont(k+1)=Vcont(k)+\Delta Vcont(k)$$

By this means, the control voltage Vcont necessary to change the output frequency by Δf each time is updated. During radar operation, the updated control voltage Vcont is output to the VCO 5, and this computation processing is performed periodically with a period of 50 μs.

In step S37, the counter k is incremented by +1, and in step S38 a judgment is made as to whether k≧(T0/4)·j. Here, j=A to D corresponds to the numbers 1 to 4. If not k≧(T0/4)·j, then processing returns to step S35, and the control voltage for the next timing is determined.

When finally k≧(T0/4)·j is satisfied in the judgment of step S38, in step S39 the area counter j is incremented by +1, and in step S40 a judgment is made as to whether j>4 (=D). If j>4 is not true, then processing returns to step S35, and similar processing is performed using the VCO gain factor for the next area. When in this way it is finally judged in step S40 that j>4, the control voltage Vcont has been determined for one period T0, and so this processing is ended. In this aspect, by performing the above PLL operation and VCO linearity calibration processing, the linearity of the VCO 5 can be automatically calibrated with high precision and used, without providing a correction table specific to each device.

FIG. 5A-5C shows timing charts of the linearity calibration operation of the first aspect; in FIG. 5A, the original frequency modulation characteristic of the VCO 5 is shown. The horizontal axis is the control voltage Vcont, and the vertical axis is the oscillation frequency. The VCO gain factor (Δf/ΔVcont) of the VCO 5 changes in nonlinear fashion, and the VCO gain factor is high on the low-frequency side of the center frequency f0, and low on the high-frequency side. Given such a modulation characteristic, by applying a control voltage Vcont as shown in FIG. 5C, a characteristic is obtained in which the frequency changes linearly, as shown in FIG. 5B.

FIG. 5B shows the preferred change with frequency for use in FM-CW radar. The output frequency of the VCO 5 changes linearly between the lower limit f1 and the upper limit f2. Linearity calibration processing is processing performed to determine, according to FIG. 5C, the control voltage Vcont to cause output of a frequency which changes linearly as shown in FIG. 5B to the VCO 5 in FIG. 5A.

Figure 6:
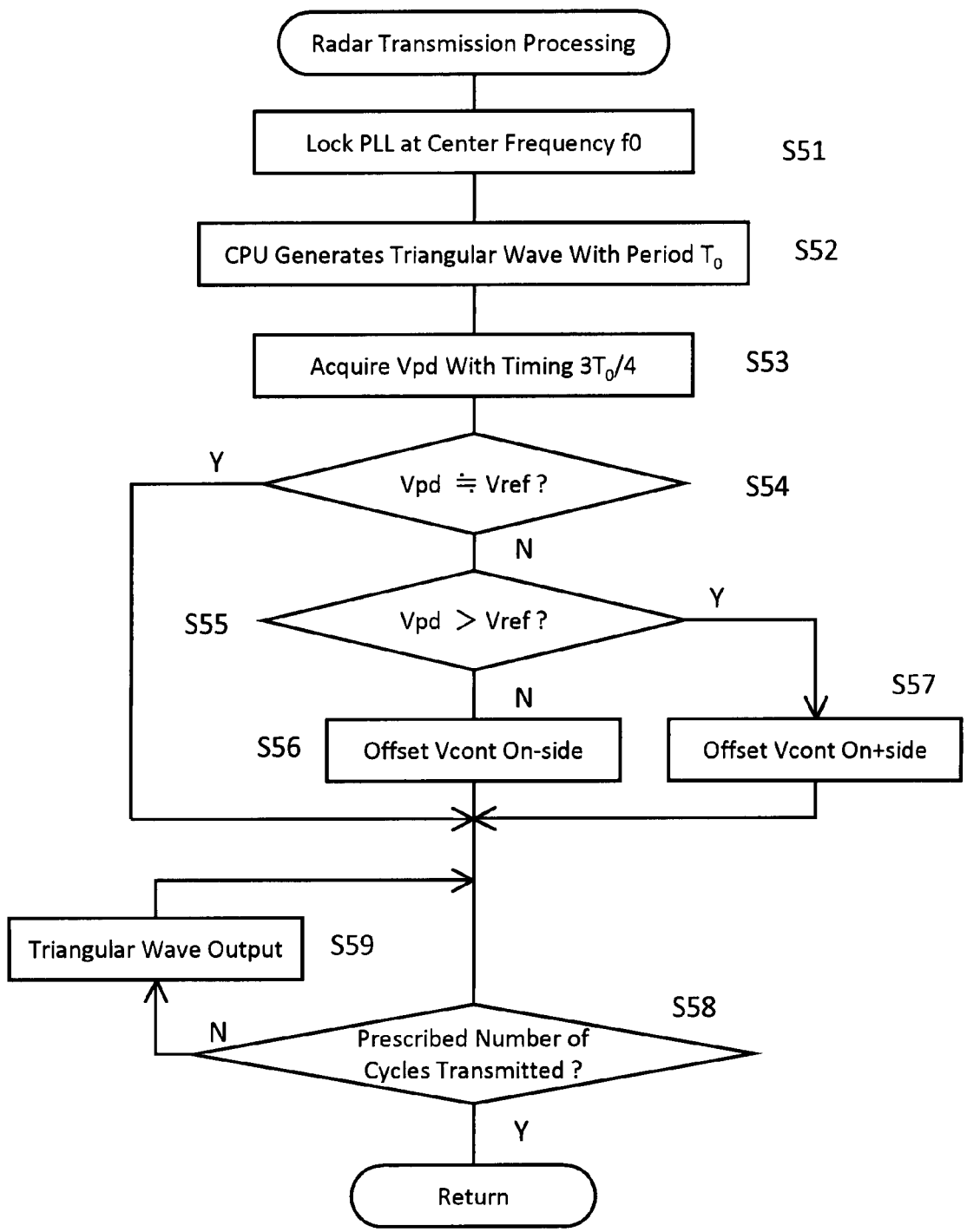
FIG. 6 is a flowchart of radar transmission processing in the first aspect.

FIG. 6 is a flowchart of radar transmission processing in the first aspect, showing a case in which, with the PLL in the open state, the CPU 15 generates a continuous triangular wave with V0 as reference, and intermittently performs loop control, at every period or at every two or more periods of the triangular wave, to maintain the center frequency at f0. In step S51, the PLL is once locked at the center frequency f0. By this means, Vpd is stabilized at approximately 2.5 V, and Vcont is approximately V0 (V0 at this time). In step S52, the CPU 15 generates a linearity-corrected triangular wave with this V0 as reference and with period T0, and applies this wave to the VCO 5. Because the PLL is left open, during the triangular wave interval, the VCO output frequency changes linearly as shown in FIG. 5B. The PLL loop can easily be left open by preventing the CPU 15 from performing loop control over this interval.

On the other hand, the PD 13 changes the phase error signal according to changes in frequency of the VCO output; but because the LPF 3 has a larger time constant larger in magnitude (for example, approximately ten times larger) than the triangular wave period, even when the triangular wave is applied to the VCO 5, the phase error signal in this interval is averaged by the LPF 3, and so only a slight fluctuation occurs during each triangular wave period in the output phase error signal Vpd.

In step S53, the phase error signal Vpd of the LPF 3 is acquired with timing 3T0/4 (center frequency). When there is no change in the characteristic of the VCO 5, the phase error signal is averaged over this interval, and is near Vpd≈2.5 V; but when there is a change in the VCO characteristic, Vpd changes gradually as a result. In step S54, a judgment is made as to whether Vpd≈Vref (=2.5 V). If Vpd≈Vref, then f0 is within the required range, and so processing advances to step S58. If not Vpd≈Vref, then in step S55 a judgment is made as to whether Vpd>Vref.

When not Vpd>Vref, processing advances to step 556, and for example the Vcont at the next time (for example V1) is offset to the negative side, in order to increase Vpd at the next T0/4. If Vpd>Vref, then in step S57 the Vcont at the next time (for example V1) is offset to the positive side, in order to decrease Vpd at the next T0/4. The CPU 15 determines the offset amount according to the digital filter of FIG. 1A. The timing with which the offset is applied to the control voltage may be the timing with which V1 is applied to the VCO 5 above, but other timing may be used. Here it should be noted that open-loop operation occurs within a period of the triangular wave, and the triangular wave characteristic of the VCO output is not modified. And, synchronized with a certain time in the triangular wave period, feedback is applied periodically (intermittently) to apply PLL control. In step S58 and subsequent processing, the number of triangular wave periods which elapse before feedback is applied is set, and so a prescribed number of triangular waves without feedback control are output. That is, in step S58, a judgment is made as to whether the number of triangular waves without feedback control equal to the prescribed number have been output; if not output, in step S59 one period of the triangular wave without feedback control is output. If the number has been output, this processing is ended.

Figure 7:
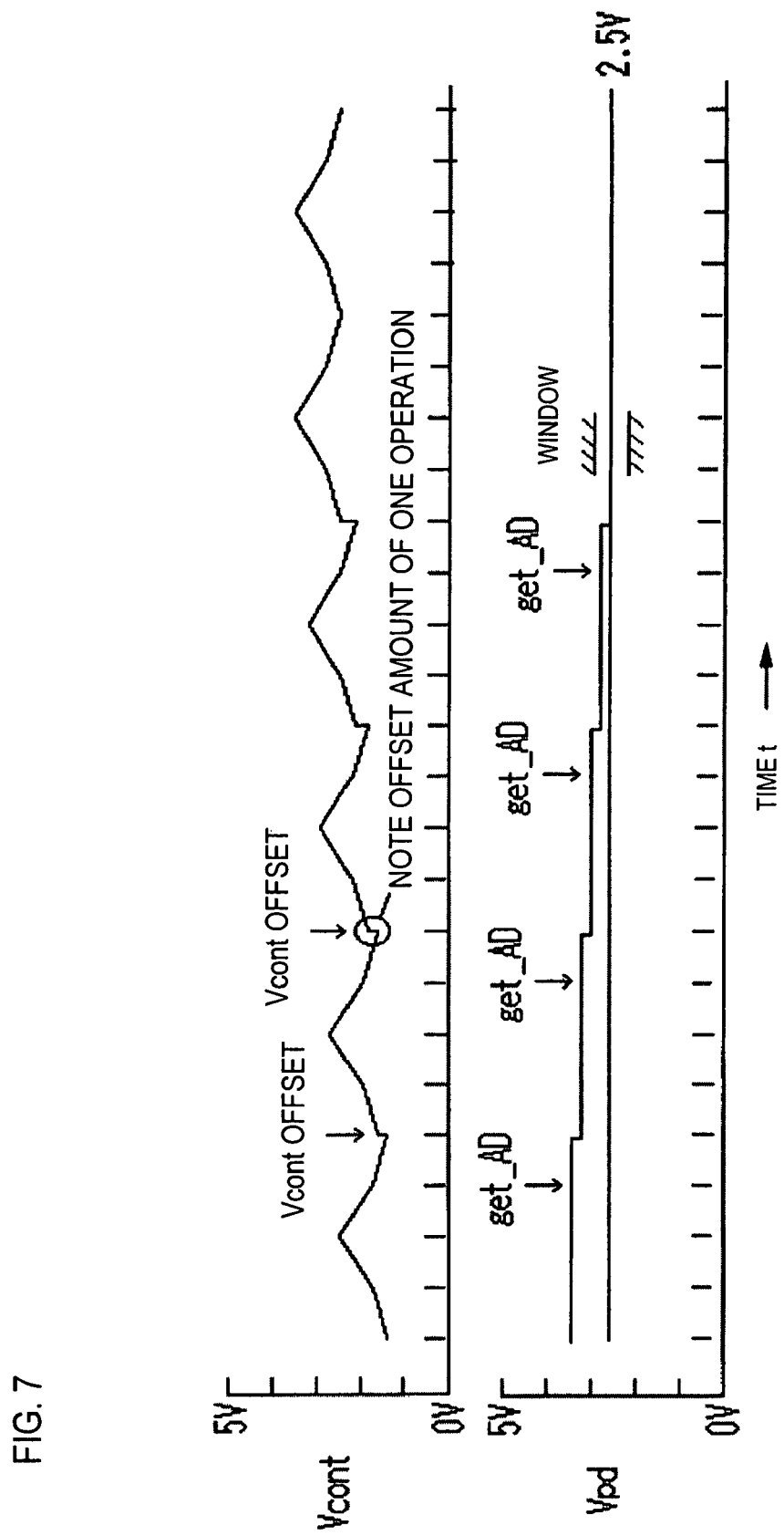
FIG. 7 is a timing chart of radar transmission operation in the first aspect.

FIG. 7 is a timing chart of radar transmission operation in the first aspect, showing a case in which the offset is applied to Vcont (V1) at each triangular wave period. In this aspect, at the instant a triangular wave has ended, feedback is applied; hence there is no dulling of the triangular wave shape of the output frequency of the VCO 5. Because the feedback period and the PLL loop gain are inversely proportional, when there is a need to lower the loop gain and retard the control response, the feedback period can be lengthened. For example, offset can be applied to the control voltage Vcont by for example using feedback back once in ten triangular wave periods to offset the value of V1, or by using feedback once in 1000 triangular wave periods to offset the value of V1.

FIG. 8A-8B are timing charts of radar working operation in the first aspect, showing a case in which, in between series of radar operations, VCO linearity calibration operations are inserted, so that the stability of radar operations can always be maintained. Because the VCO 5 has a temperature characteristic, if the temperature changes during radar operations, the control voltage V0 necessary to cause output of the center frequency f0 also changes. In this aspect, by recalibrating the linearity periodically, the stability of radar operations can always be maintained.

FIG. 8A shows a case of measurement of control voltages V1, V0, V2 between series of radar operations, and linearity calibration performed using these. A configuration may also be employed in which, when temperature changes are detected separately and the temperature change is equal to or greater than a prescribed change, measurements of the control voltages V1, V0, V2 and linearity calibration are performed. The order of measurement of the control voltages is arbitrary; for example, the measurement for the center frequency f0 can be performed last. In this case, the PLL loop is already locked on the frequency f0, and so when continuing radar operations, the processing of step S51 described above in FIG. 6 can be omitted.

FIG. 8B shows a case in which measurements of each of the control voltages V1, V0, V2 are performed in order between series of radar operations, and together with the final measurement of V2, linearity calibration of VCO 5 is performed. By this means, the measurement time per control voltage is made short, and so there is the advantage that radar operation dead time can be kept short. This method is particularly useful in a case, not shown, in which in addition to the above three control voltages V1, V0, V2, the number of measurement points of the control voltage is further increased, to perform more precise linearity calibration.

Figure 9:
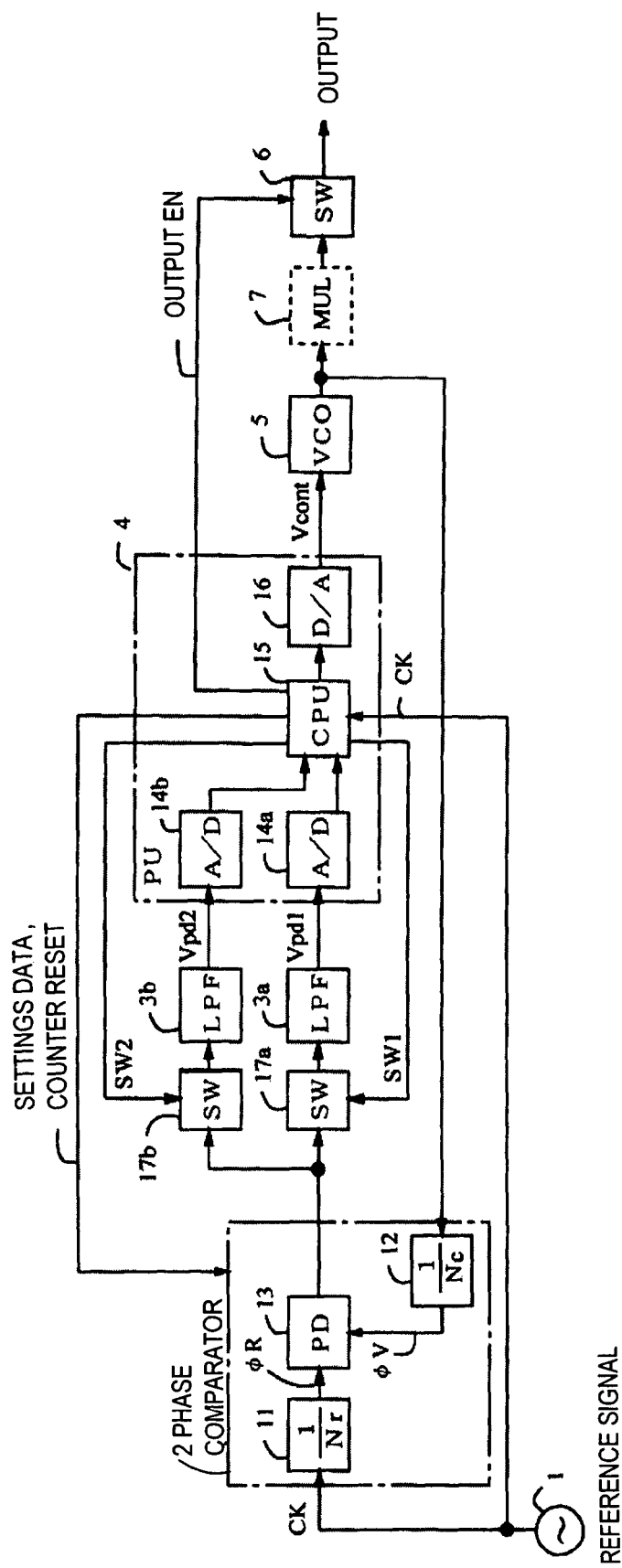
FIG. 9 is a block diagram of the phase-locked oscillator of a second aspect.

FIG. 9 is a block diagram of the phase-locked oscillator of a second aspect, showing a case in which two LPFs are comprised, for radar and for VCO calibration, enabling rapid PLL pull-in during either operation. In the figure, the output of the PD 3 is input to both LPFs 3a and 3b via the switches 17a and 17b. LPF 3a integrates the phase error signal sampled with the center frequency output timing, mainly during VCO driving; LPF 3b is used for the purpose of integrating the phase error signal mainly during control voltage measurement. It is preferable that the time constant of LPF 3b be made smaller than the time constant of LPF 3a, so that the time for measuring the control voltage at each frequency can be shortened.

The variable frequency dividers 11, 12 in this example are configured such that the counters can be reset from the CPU 15; by resetting both counters simultaneously, the initial phases of both frequency dividers φR and φV can be forcibly made to coincide. Further, a configuration is employed in which the switch SW 7a turns on/off passage of a signal, and the LPF 3a integrates the phase error signal during the interval in which SW 7a is turned on, and retains the integrated value (charge on the capacitor) accumulated thus far when SW 7a is turned off. Switch SW 7b and LPF 3b operate similarly. In this aspect, by effectively utilizing such a configuration, the PLL loop pull-in time can be greatly shortened. Details are explained below.

Figure 10:
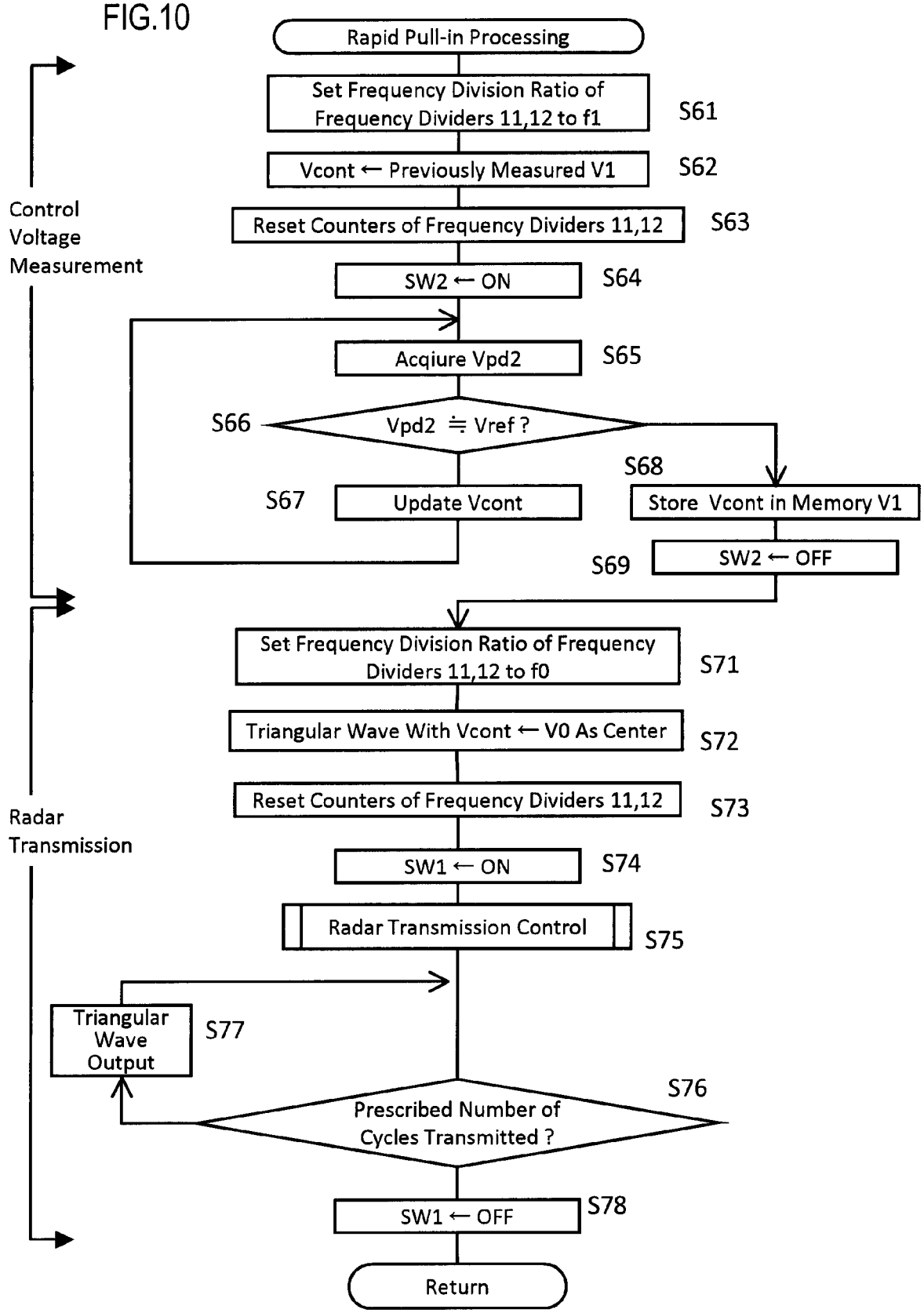
FIG. 10 is a flowchart of rapid pull-in processing of the phase-locked oscillator in the second aspect.

FIG. 10 is a flowchart of processing to perform high-speed pull-in in the phase-locked oscillator of the second aspect; this processing comprises processing for measurement of for example control voltage V1 in the first half, and radar operation processing in the second half. For example, after the end of the immediately preceding radar operation, this processing is begun. In step S61, the frequency division ratio of the variable frequency dividers 11, 12 is set to f1. In step S62, the value of V1 which had been acquired and stored in the previous measurement of V1 is set as the control voltage Vcont. By this means, VCO5 is made to generate the lower limit frequency f1 which was generated when locked in the previous measurement V1, regardless of temperature changes. In step S63, the counters of the variable frequency dividers 11, 12 are reset, and by this means the initial phases of both frequency-divided signals φR, φV are rapidly made to coincide.

In step S64, on completion of the preparations for V1 measurement, the switch control signal SW2 is turned on, and PLL operation becomes possible via LPF 3b. At this time, the internal capacitor of LPF 3b is holding the phase error voltage Vpd2 (≈2.5 V) which was held at the time the locked state was reached during the previous control voltage measurement; this phase error voltage Vpd2 is, in this locked state, approximately Vref (for example, approximately 2.5 V), regardless of whether the previously measured voltage was V1, V0, or V2. Hence this measurement can also be begun from a state close to a PLL loop locked state, and so convergence on the locked state at an earlier time is possible, regardless of the loop time constant. In step S65, Vpd2 is acquired. In step S66, a judgment is made as to whether Vpd2≈Vref; if "no", then in step S67 Vcont is updated in the direction such that Vpd2 approaches Vref, and processing returns to step S65.

When in this way, in the judgment of the above step S66, it is finally judged that Vpd2≈Vref, in step S68 the Vcont at this time is acquired, and is stored in storage memory as control voltage V1. In step S69 the switch control signal SW2 is turned off, and by this means the phase error voltage Vpd2 for this locked state is held in the capacitor within LPF 3b.

Next, radar operation is begun, and in step S71 the frequency division ratio of the variable frequency dividers 11, 12 is set to the center frequency f0. In step S72 a triangular wave signal centered on V0 is superposed on Vcont. In step S73 the counters of the variable frequency dividers 11, 12 are reset, and the initial phases of the two frequency-divided signals φR, φV are rapidly made to coincide. In step S74, on completion of preparations for radar operation, the switch control signal SW1 is turned on, and PLL operation is enabled via LPF 3a. At this time, the capacitor within LPF 3a holds the phase error voltage Vpd1 (approximately 2.5 V) held at the time a substantially locked state was maintained during the previous radar operation.

In step S75 the radar transmission control described in the above FIG. 6 is performed, and in step S76 a judgment is made as to whether the prescribed number of cycles of triangular-wave transmission have been performed. If transmission has not ended, in step S77 one period of the triangular wave without feedback control is output. In this way, when in the judgment of step S76 the prescribed number of cycles have been transmitted, in step S78 the switch control signal SW1 is turned off, and by this means the phase error voltage Vpd1 during locking in the current radar operation is held by the capacitor in the LPF 3a.

Figure 11:
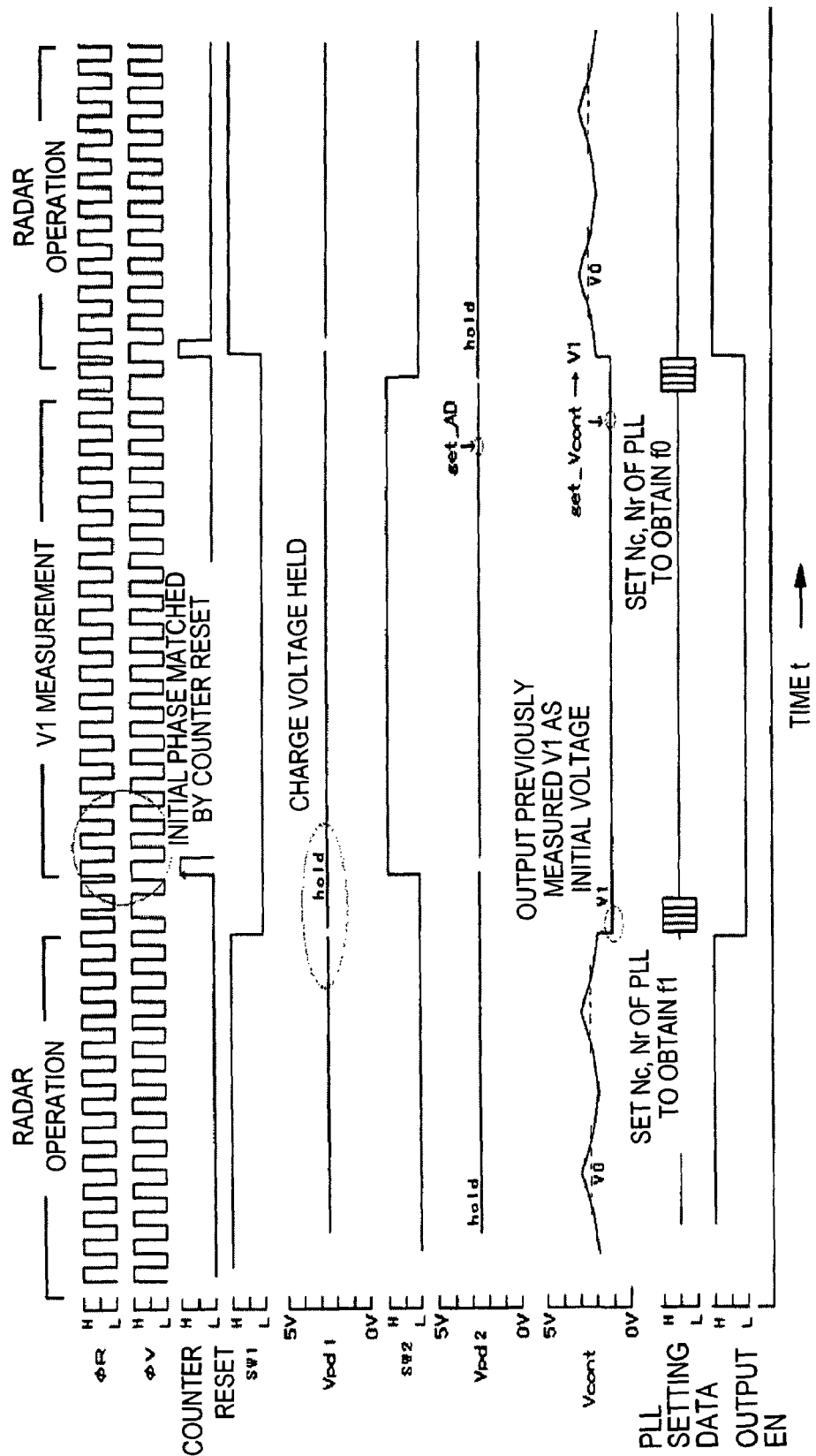
FIG. 11 is a timing chart of rapid pull-in operation of the phase-locked oscillator in the second aspect.

FIG. 11 is a timing chart of rapid pull-in operation of the phase-locked oscillator in the second aspect, showing a case in which processing to measure the control voltage V1 is inserted between series of radar operations. When the previous radar operation is completed, the switch control signal SW1 is turned to off (L), and the Vpd1 of LPF 3a is held. The CPU 15 sets the frequency division ratio for variable frequency dividers 11, 12 in order to obtain f1, and outputs the previously measured V1 as Vcont. Further, the counters of the variable frequency dividers 11, 12 are reset, and initial phases are made ot coincide. With the above, preparations for the measurement operation are completed, and so the switch control signal SW2 is turned on (H), and PLL operation is performed according to the phase error signal Vpd2 of LPF 3b. When in this way Vpd2 is finally confirmed to be within the locked range, the CPU 15 stores the Vcont at this time as the new V1. When measurement of V1 is completed, the switch control signal SW2 is turned off, and the Vpd2 at this time is held.

Upon beginning the next radar operation, the frequency division ratio is set in the variable frequency dividers 11, 12 to obtain f0. Then, a triangular waveform centered on V0 is output from the CPU 15. Calibration of the triangular wave in this example is performed after measurement of V2. The counters of the variable frequency dividers are reset, and the initial phases made to coincide. Preparations for radar operation are then completed, and so the switch control signal SW1 is turned on, and PLL operation is performed at Vpd1 for radar. Thereafter V0 and V2 are similarly acquired, and the linearity configuration data is updated.

Figure 12:
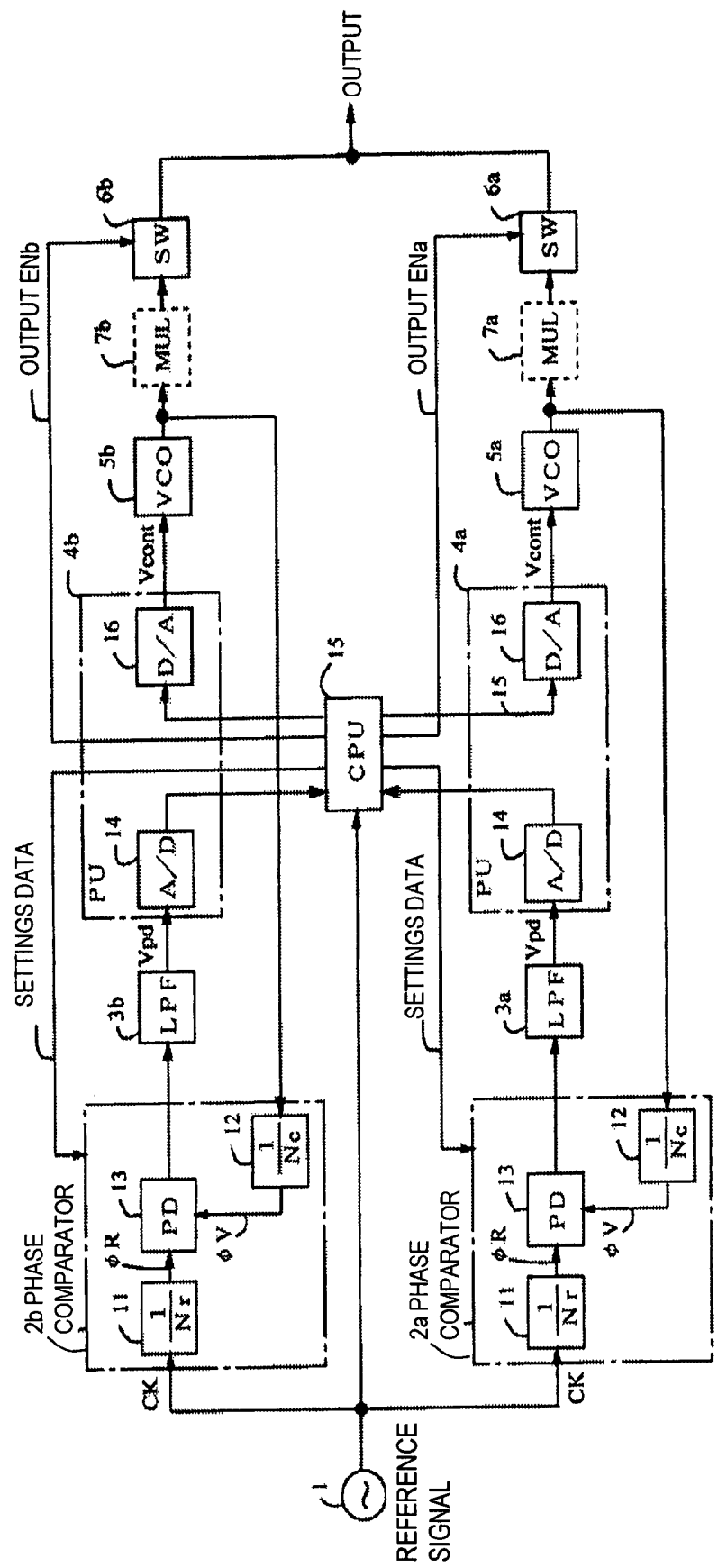
FIG. 12 is a block diagram of the phase-locked oscillator of a third aspect.

FIG. 12 is a block diagram of the phase-locked oscillator of a third aspect, showing a case in which two PLL circuits are comprised; these are controlled by a single CPU 15, with one of the loops used to execute radar operations, while the other loop is used to perform linearity calibration of the VCO circuit, and these are performed by the two PLL circuit systems in alternation. By this means, radar operation dead time can be eliminated.

Figure 13:
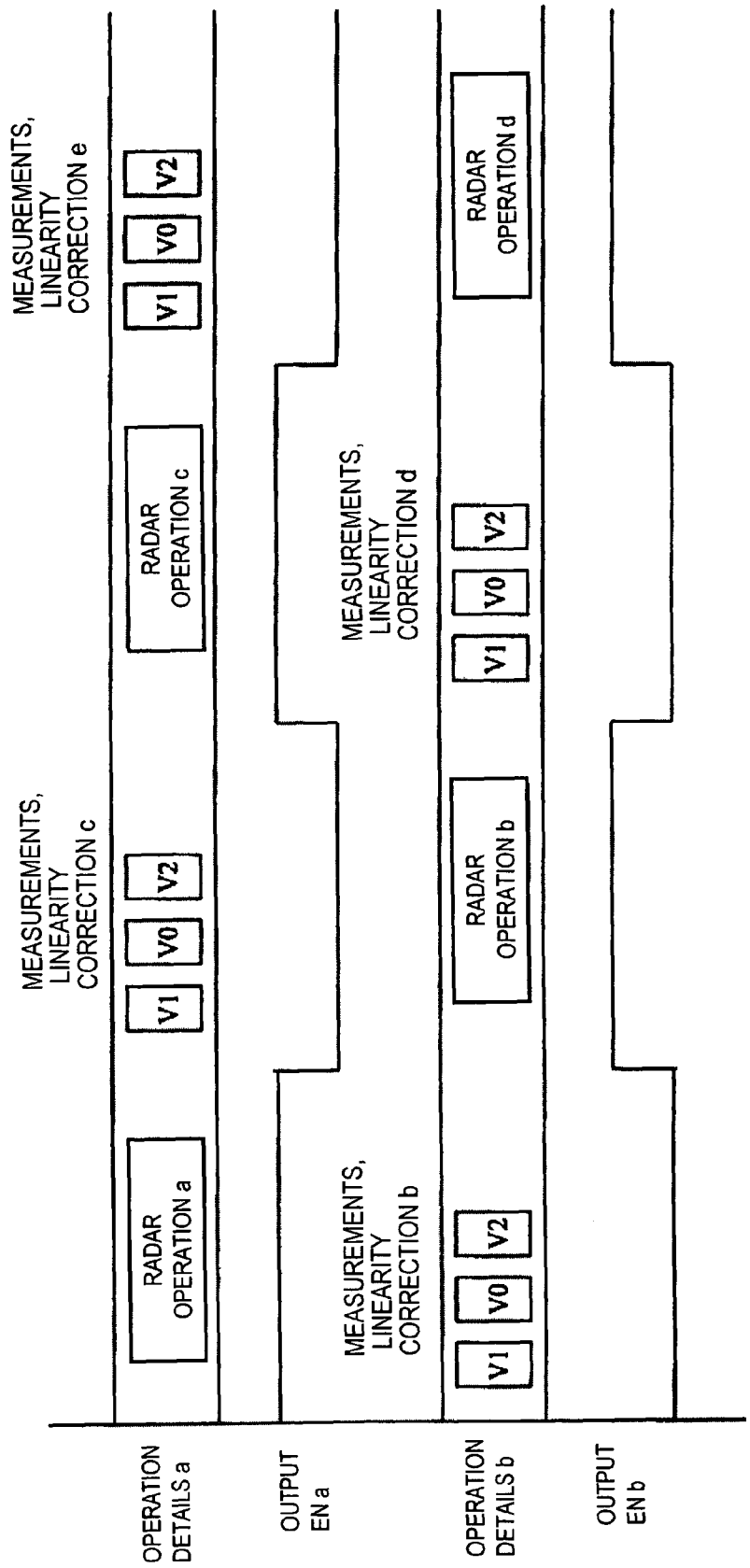
FIG. 13 is a timing chart of operation of the phase-locked oscillator of the third aspect.

FIG. 13 shows the operation timing chart of the phase-locked oscillator of the third aspect. Radar operations are performed by PLLa, and measurement of V1, V0 and V2 as well as linearity calibration of the VCO 5b are performed using PLLb. Then, PLLb is used to perform radar operations, while PLLa is used in measurements of V1, V0 and V2 and in linearity calibration of the VCO 5a. Switching may for example be performed periodically, such as every five minutes, or may be performed when the change in external air temperature exceeds a certain range.

Figure 14A:
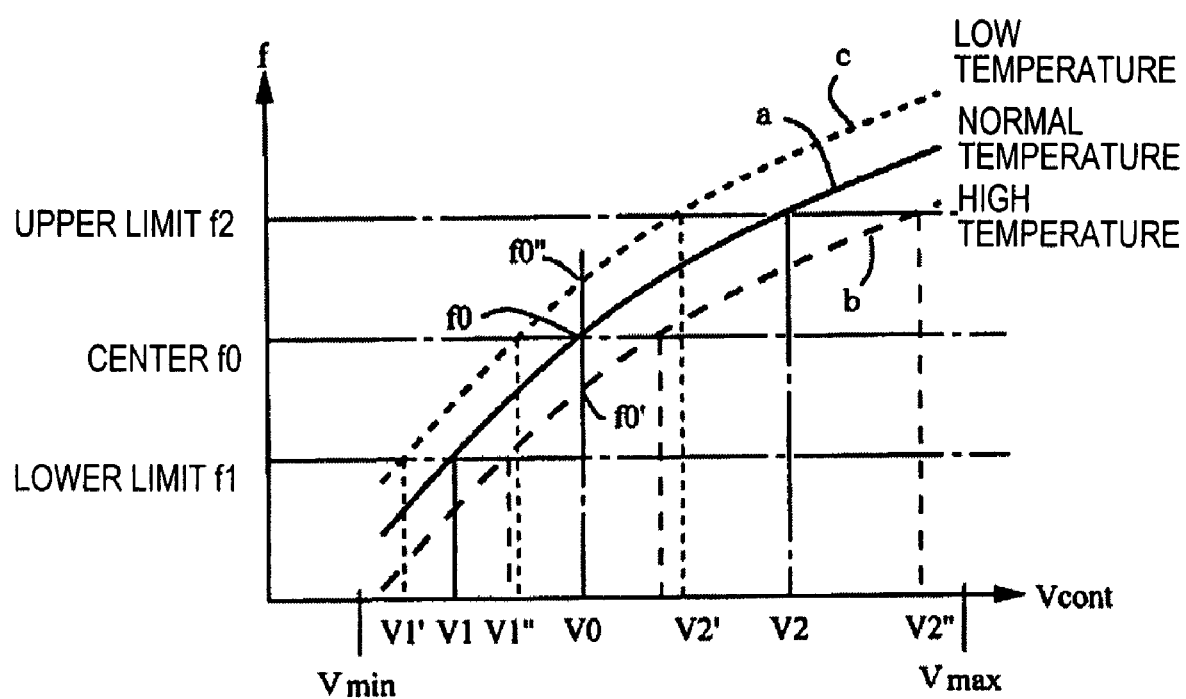
FIG. 14A-14B explain the phase-locked oscillator of the fourth aspect.
Figure 14B:
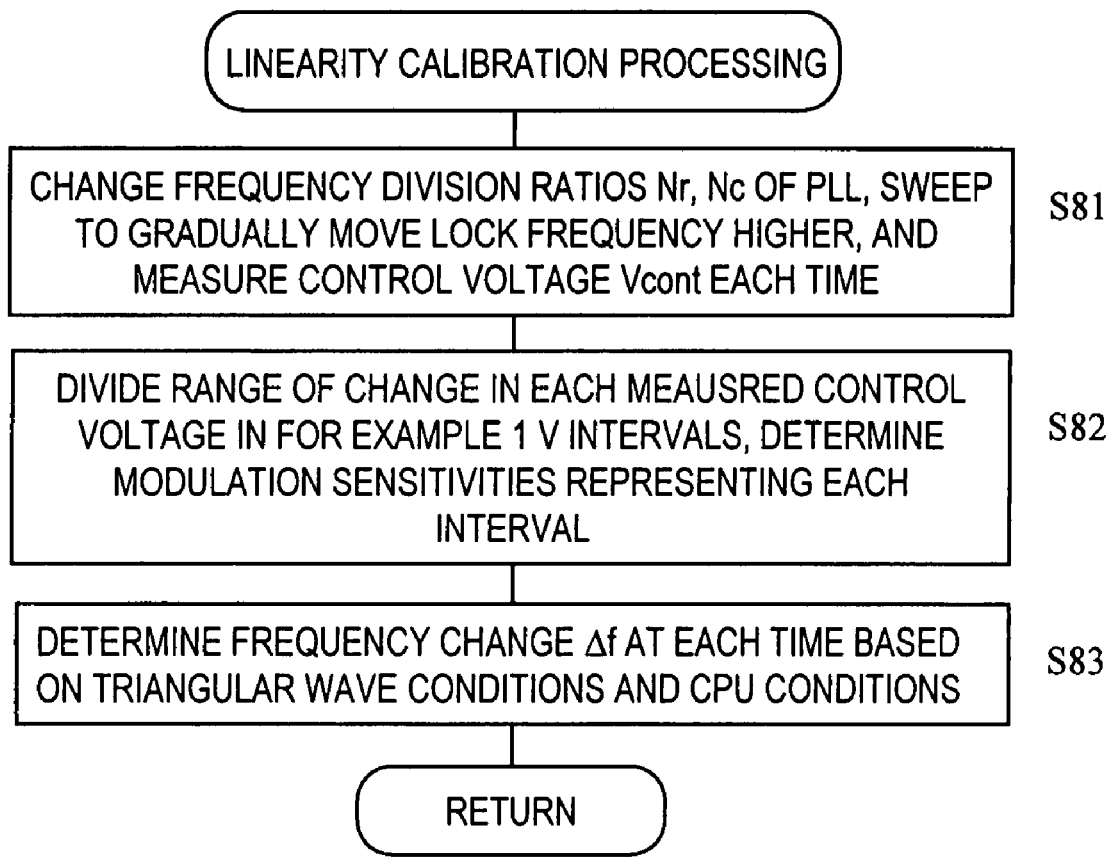

FIG. 14A-14B explain the phase-locked oscillator of a fourth aspect, showing a case in which application is suitable to a VCO circuit the oscillation frequency of which drifts due to temperature changes, but the VCO gain factor of which does not much change with temperature. In practical terms, there are some VCO circuits that have such characteristics. The PLL circuit may be similar to those explained in the above FIG. 1, FIG. 9 or FIG. 12. The modulation characteristic of this type of VCO circuit is shown in FIG. 14A. If the modulation curve at normal temperature is a, then at high temperature there is a shift toward curve b, and at low temperature there is a shift toward curve c. In such a VCO circuit, even when the same control voltage V0 is applied, the oscillation frequency changes between f0' and f0" depending on the temperature; but the VCO gain factor does not change much in the vicinity of V0, and so the $\Delta$Vcont necessary to change the frequency by $\Delta$f likewise does not change with temperature. This can be said of the entire control voltage range from Vmin to Vmax.

FIG. 14B is a flowchart showing linearity calibration processing for this VCO circuit. In step S81, by changing the frequency division ratios Nr and Nc of the variable frequency divider, the locked frequency is gradually increased to perform sweeping, and each time the control voltage Vcont is measured. In step S82, for each of the previously measured control voltages Vcont, the possible range of variation Vmin to Vmax of the control voltage is for example divided at every 1 V, and modulation sensitivities a01, a12, a23, ..., representing each interval are determined. In step S83, the frequency change $\Delta$f (constant in this example) at each point in time is determined based on the triangular wave conditions and on the CPU conditions. In this way, a sensitivity table which can be used in common, regardless of temperature changes, is obtained.

Although not shown, during radar transmission, first the PLL is locked at f0, and the control voltage V0 at this time is determined. Then, with for example this V0 as a starting point, Vcont is increased by $\Delta$f at a time until the upper limit frequency f2 is reached. Here the voltage interval in which Vcont exists at each time is judged, and by utilizing the VCO gain factor of each corresponding interval, the voltage change for the interval is determined. When in this way f2 is finally reached, Vcont is then decreased until the lower limit frequency f1 is reached, and is then increased until f0 is reached. This control is then repeated. Hence by means of this aspect, radar waves can always be transmitted within the appropriate frequency range, regardless of changes in temperature. Further, because there is no need to perform linearity calibration processing due to temperature changes, radar operations can be kept working without interruption.

Figure 15:
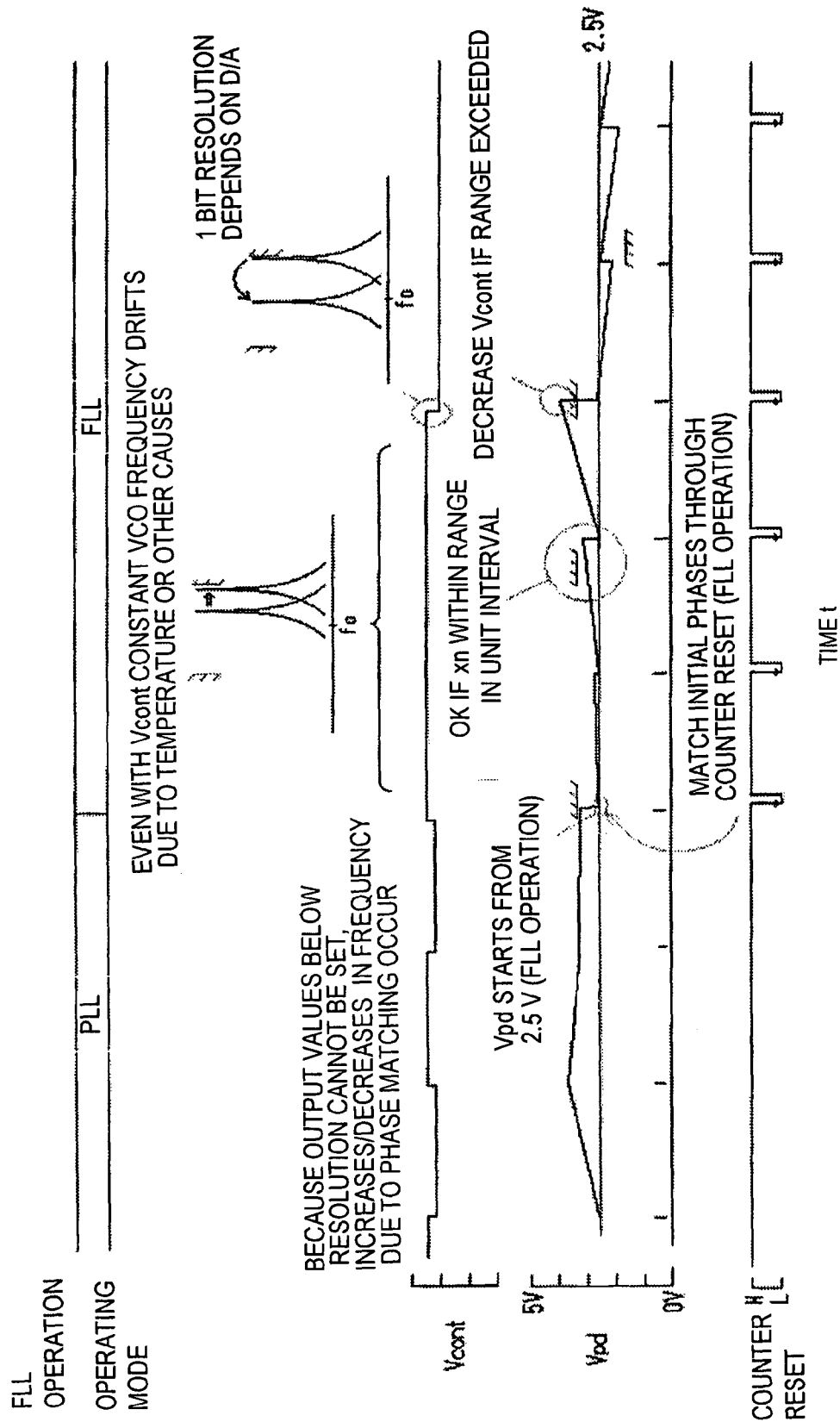
FIG. 15 is a diagram (1) explaining the phase-locked oscillator of a fifth aspect.

FIG. 15 and FIG. 16 are diagrams (1) and (2) explaining the phase-locked oscillator of a fifth aspect; FIG. 15 shows a case of so-called FLL (frequency-locked loop) control in which, in place of PLL control to cause even the phases of the two frequency-divided signals $\phi$R and $\phi$V to coincide, it is sufficient to cause only the frequencies to coincide, without requiring that the phases match as well. In general, when the control voltage Vcont is D/A converted and applied to the VCO 5, the output frequency of the VCO 5 changes, at minimum, in steps of the magnitude equal to the one-bit voltage resolution of the D/A converter 16 multiplied by the VCO gain factor. On the other hand, a PLL loop (that is, LPF 3) operates in analog fashion such that the average frequency of the radar transmission wave resulting from triangular-wave driving is f0, and so if the lock detection width for the phase error signal Vpd is made too narrow, then offset correction of the control voltage V0 occurs frequently. In order to resolve this problem, in this fifth aspect FLL control is performed in place of PLL control. The circuit configuration may for example be similar to that of FIG. 1, but here a configuration is employed such that the counters of the variable frequency dividers 11, 12 can be reset from the CPU 15.

In general, with the VCO 5 in the free-running state (that is, with the PLL loop left open), the phase between the frequency-divided signals $\phi$R. and $\phi$V tend to slowly shift (slip) even when the frequencies of the two frequency-divided signals $\phi$R and $\phi$V coincide; in this fifth aspect, by resetting the counters of the variable frequency dividers 11, 12 at each period, the occurrence of a large phase difference within one period of the triangular wave can be effectively avoided. However, if the oscillation frequency of the VCO 5 deviates from the required frequency, the phase difference between the signals $\phi$R and $\phi$V also increases rapidly in a short time; such a state can be reliably detected by observing the phase error signal Vpd at each period.

In FIG. 15, in this aspect based on FLL control, it is sufficient that the frequency of the output of the VCO 5 be within the prescribed range, without causing the phases of the two frequency-divided signals $\phi$R and $\phi$V to be coincident; hence the counters of the variable frequency dividers 11, 12 are reset for example once each period of the triangular wave, and when a change in Vpd by at least a prescribed amount is detected within a unit interval (for example one period), it is assumed that the output frequency is outside the prescribed range, and the control voltage Vcont is offset. FIG. 16 shows operation of the phase detector 2. As the method for realizing FLL control, by resetting the counters of the variable frequency dividers 11, 12 periodically (every period, or every two or more periods, of the triangular wave), FLL control can easily be accomplished.

Figure 17:
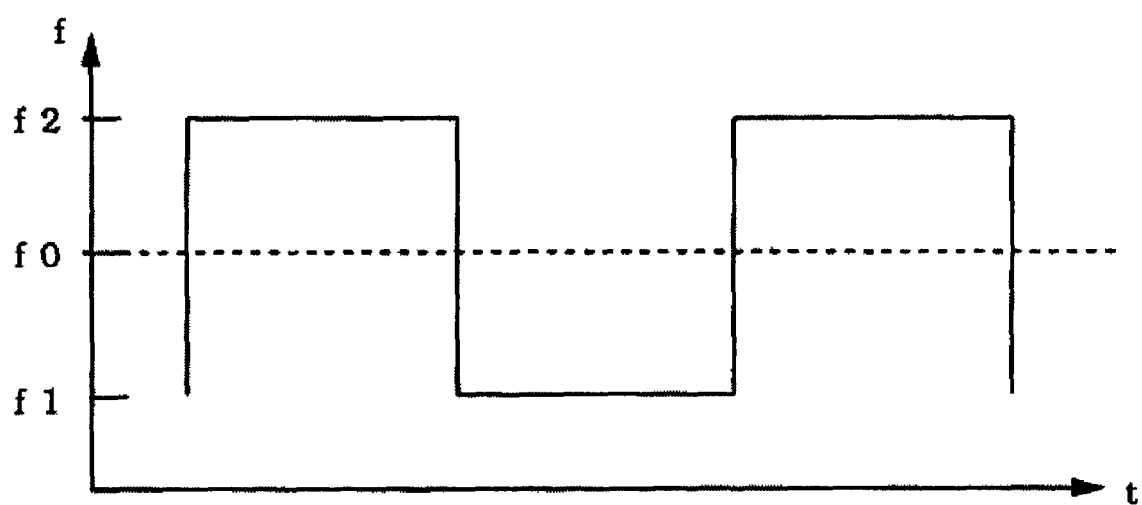
FIG. 17 explains the phase-locked oscillator of a sixth aspect.

FIG. 17 explains the phase-locked oscillator of a sixth aspect, showing a case in which, instead of generating a triangular wave, the CPU 15 generates a linearity-calibrated step-function signal. The configuration of the phase-locked oscillator may be the same as in the above FIG. 1, FIG. 9 or FIG. 12. In the figure, the VCO 5 of this example alternates periodically between the output frequencies f1 and f2 as time t advances. The center frequency is f0. Such a phase-locked oscillator is suitable for application to a two-frequency CW radar device.

Figure 18A:
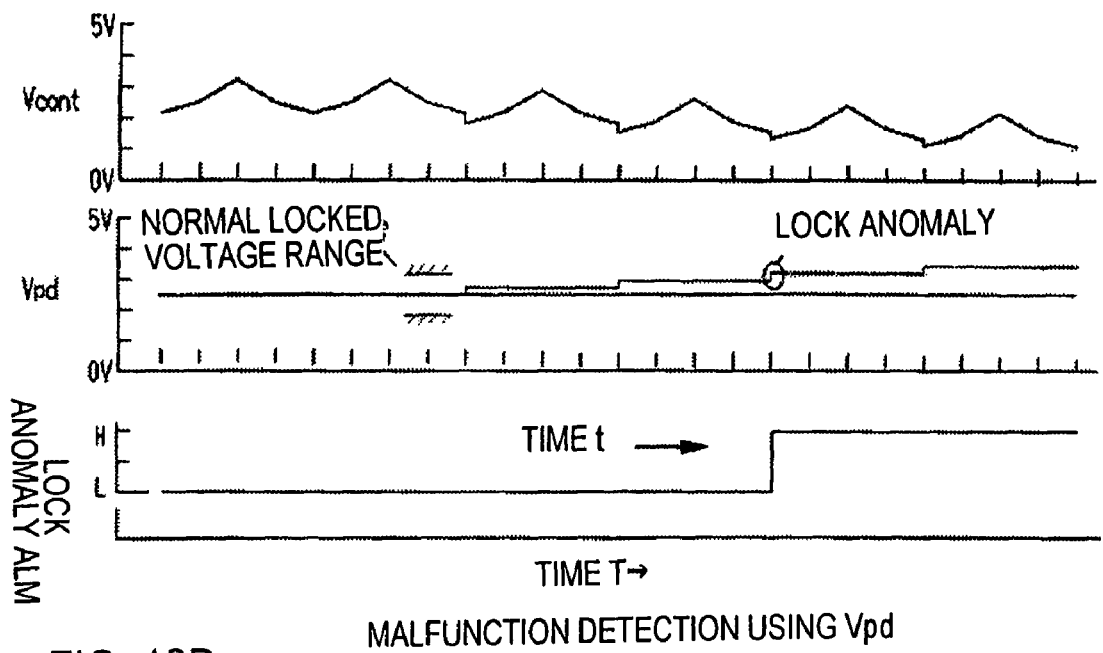
FIG. 18A-18B are diagrams (1) explaining the malfunction detection operation of an aspect.
Figure 18B:
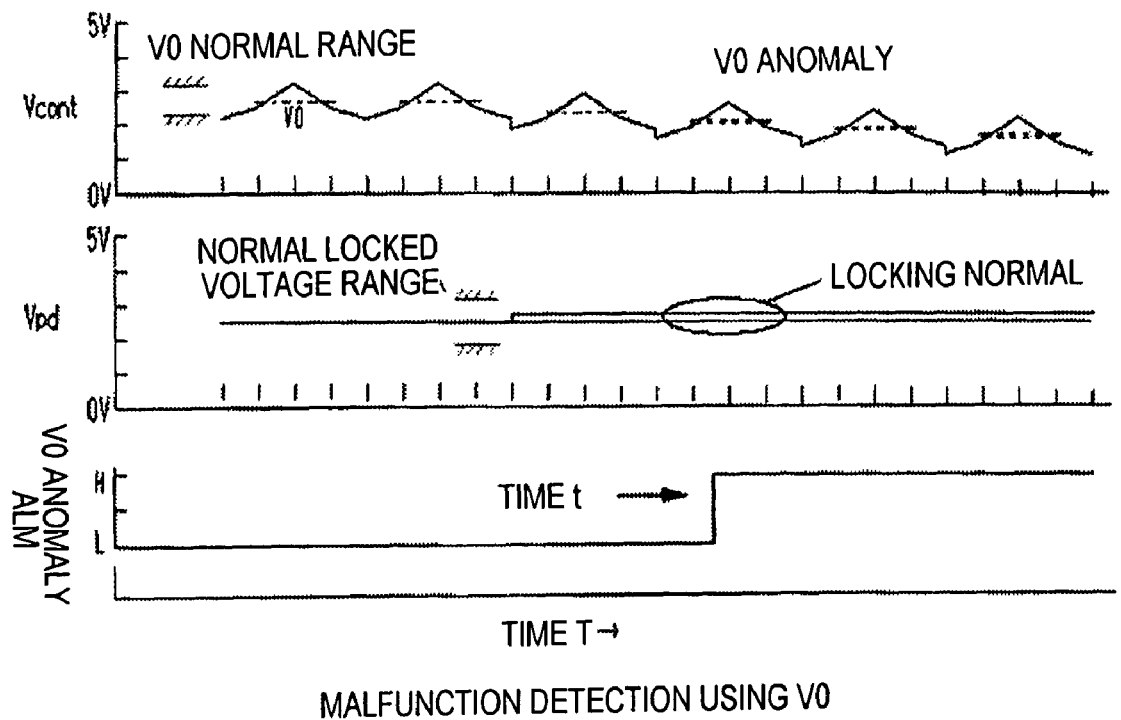
Figure 19:
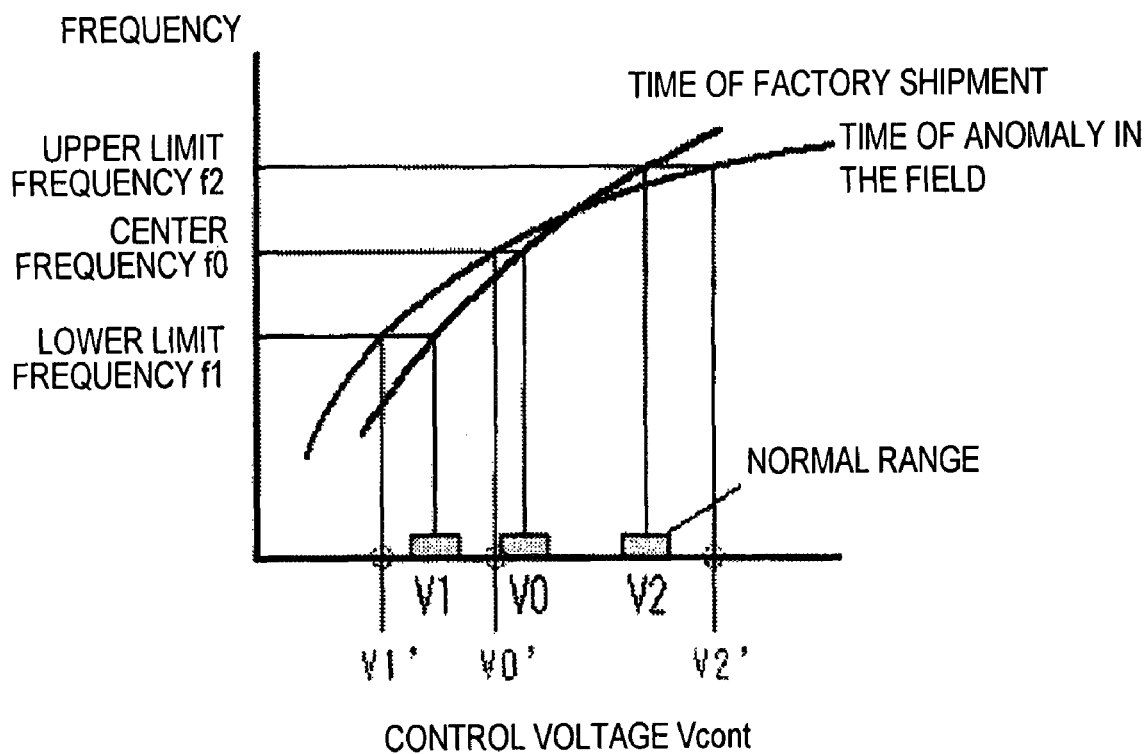
FIG. 19 is a diagram (2) explaining the malfunction detection operation of an aspect.

FIG. 18A-18B and FIG. 19 are figures (1) and (2) explaining malfunction detection operation in the aspect; FIG. 18A shows a case in which the phase error signal Vpd is at an abnormal level during normal operation. When this device is mounted in a vehicle, human lives may be involved, and so the operating state must always be monitored. In this aspect, when during normal operation the phase error signal Vpd deviates from the normal voltage range in which PLL pull-in is possible, a lock anomaly is detected.

FIG. 18B shows a case in which the center control voltage V0 is at an anomalous level during normal operation. Under harsh usage conditions, such as for example when water penetrates into the housing, or when there is condensation or similar, the center frequency f0 (that is, control voltage V0) may change considerably. In this aspect, an anomaly in VCO operation is detected when the control voltage V0 deviates from the normal range during normal operation.

FIG. 19 shows a case in which the linearity calibration result is abnormal when power is turned on. The VCO characteristic is degraded due to changes with aging. In this aspect, a PLL loop is formed and linearity is calibrated when device power is turned on or periodically, and the Vcont measurement values V0, V2, V1 for the frequencies f0, f2, f1 at the time power is turned on are compared with the values at the time of factory shipment, and if deviation of any one or more of these by a prescribed amount or more is detected, an anomaly is judged to have occurred. In this example, judgments are made as to whether absolute voltages are within specified ranges; however, relative voltage values may be compared with specified ranges in each case as well.

In the above FIG. 1, FIG. 9 and FIG. 12, when this circuit is used in a millimeter-wave band FM-CW radar system or similar, a millimeter-wave band variable frequency divider 12 is used; but when such a variable frequency divider is difficult to acquire or is expensive, a variable frequency divider 12 for lower frequencies may be used, or the output of the VCO 5 may be multiplied to the millimeter-wave band by a frequency multiplier (MULTI) 7 and output.

Further, signals generated by the CPU 15 can be various other signal waveforms (sine waves, sawtooth waves, and similar) in addition to the above triangular-wave signals and step-function signals.

Further, in the above aspect, the VCO gain factor of the VCO 5 was linearly approximated over the three measurement points f1, f0, f2; but other methods may be used. By increasing the number of measurement points, more precise approximations are possible, and the precision of linearity calibration can be improved.

In the above aspect, the VCO gain factor over a plurality of intervals was represented by linear approximations within each interval; but other methods may be used. Curves in each interval may be approximated more faithfully by means of higher-order functions, exponential functions, or similar.

In the above aspect, the clock signal CK was used in common by the phase comparator 2 and the CPU 15; but a clock signal of a separate system may be used for the CPU 15.

(Multi-Radar System)

Below, a multi-radar system, in which are arranged a plurality of radar units employing the above-described phase-locked oscillators, is described.

Figure 20:
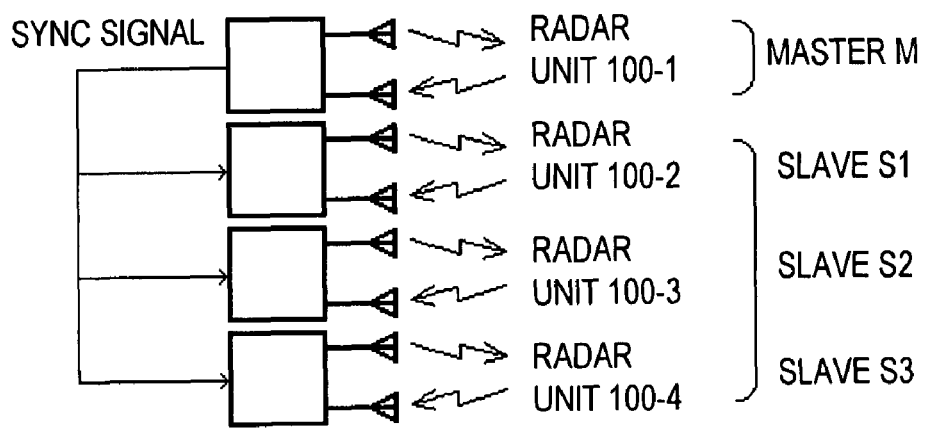
FIG. 20 shows in summary an example of the configuration of the multi-radar system of a seventh aspect.

FIG. 20 is a diagram showing in summary an example of the configuration of the multi-radar system of a seventh aspect. The multi-radar system comprises a plurality of FM-CW radar units (hereafter simply called "radar units") 100-1, 100-2, 100-3, 100-4 (hereafter, when not distinguishing between radar units, these are called "radar units 100"). In the following explanation, a multi-radar system comprising four radar units is explained as one example, but the number of radar units is not limited to four, and a plurality of radar units in the required number can be arranged. Also, the configuration of FIG. 20 is that of a multi-radar system in which a plurality of radar units are mounted on a single device.

One among the plurality of radar units (for example, radar unit 100-1) functions as the master radar unit M, and as described below, generates a sync signal according to a triangular wave output, and outputs this sync signal. The remaining radar units (for example, radar units 100-2 to 100-4) function as slave radar units S (S1 to S3) which input the sync signal from the master radar unit M and output a triangular wave according to the sync signal.

Figure 21:
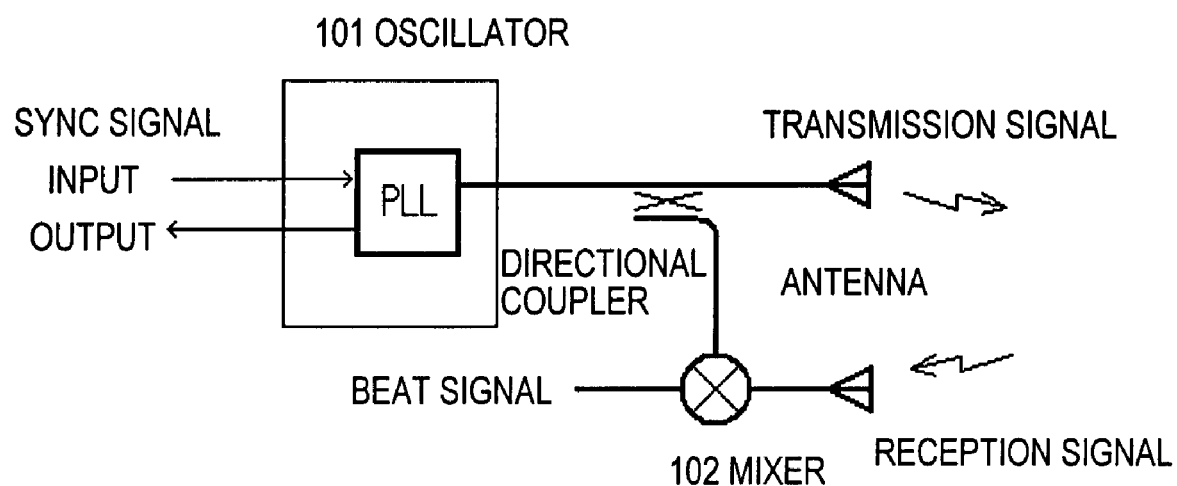
FIG. 21 shows in summary an example of the configuration of each radar unit.

FIG. 21 is a diagram showing in summary an example of the configuration of a radar unit. In each radar unit 100 comprised by the multi-radar system, an oscillator 101 generates a transmission signal frequency-modulated by a triangular wave, and the transmission signal is radiated from an antenna. This oscillator 101 is a phase-locked oscillator according to an aspect of the invention described above. A signal which has been reflected by a target object is received by the antenna as a reception signal, and upon mixing with the transmission signal by the mixer 102, a beat signal is obtained. The transmission signal frequency-modulated by the triangular wave has a frequency which changes with time, and the reception signal is a reflected wave of the transmission signal radiated earlier by a time equal to the round-trip time, so that by utilizing the frequency displacement from the current transmission signal, the distance to the target object can be calculated. In order to calculate the relative velocity of the target object, the frequency deviation of the reflected wave due to the Doppler effect is utilized. The distance to the target object and the relative velocity of the target object are determined by analyzing the beat signal and using a well-known calculation method.

Figure 22:
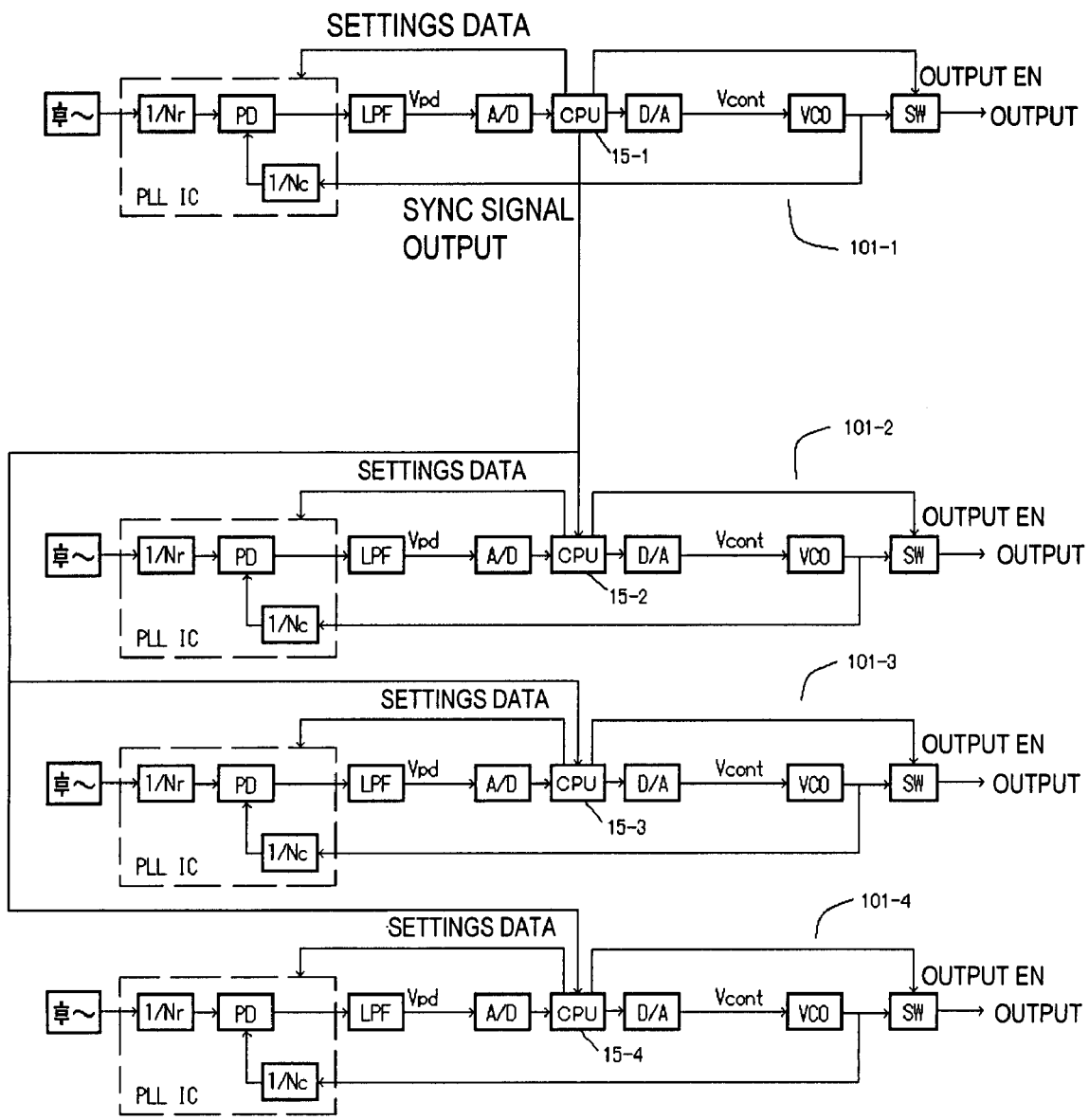
FIG. 22 shows the configuration of the oscillator 101 in each radar unit 100 of the multi-radar system of the seventh aspect.

FIG. 22 shows the configuration of the oscillator 101 in each radar unit 100 in the multi-radar system of the seventh aspect. The oscillator 101-1 is the oscillator of radar unit 100-1, the oscillator 101-2 is the oscillator of radar unit 100-2, the oscillator 101-3 is the oscillator of radar unit 100-3, and the oscillator 101-4 is the oscillator of radar unit 100-4 (when oscillators are not distinguished, they are called "oscillator 101"). Each oscillator 101 is configured as for example the phase-locked oscillator of the first aspect shown in FIG. 1. The CPU 15-1 of the oscillator 101-1 of the radar unit 100-1, which functions as the master radar unit, generates a triangular wave and outputs a sync signal with prescribed timing.

Figure 23:
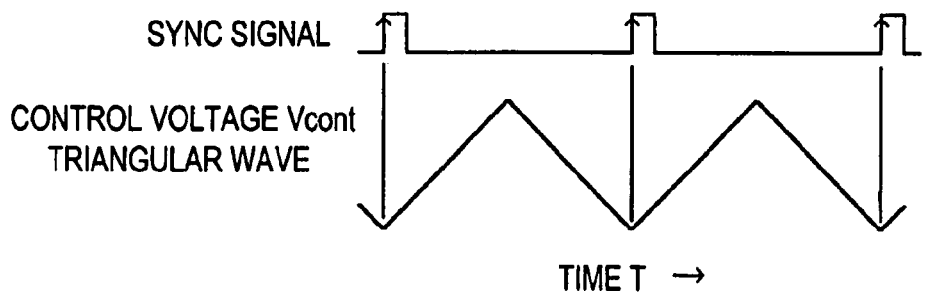
FIG. 23 explains sync signal output.

FIG. 23 explains the sync signal output. As shown in the figure, the sync signal is for example output once for each triangular wave period.

In FIG. 22, the sync signal output from the CPU 15-1 is input to the CPUs 15-2, 15-3, 15-4 of the oscillators 101-2, 101-3, 101-4 of the radar units 100-2, 100-3, 100-4 which function as slave radar units. The CPUs 15-2, 15-3, 15-4 output a triangular wave synchronized with the sync signal.

In FIG. 23, each of the CPUs 15-1 to 15-4 (when the CPUs are not distinguished, they are called the "CPUs 15"), upon detecting the rising edge of the input sync signal, initiates output of the triangular-waveform control voltage Vcont, and as a result, the transmission signal is frequency-modulated by a triangular waveform of one period. By continuously inputting the sync signal with the period of the triangular wave, the transmission signal is continuously frequency-modulated by the triangular wave.

As explained above, CPUs 15-1 to 15-4 are comprised as examples of triangular-wave generators which generate a plurality of synchronized triangular waves, and moreover, using the plurality of triangular waves as control signals, a plurality of VCOs are comprised which output signals frequency-modulated according to the respective control signals. The plurality of voltage-controlled oscillators outputs frequency-modulated signals having different center frequencies, and by setting the output frequencies such that relative to the lower limit frequency of a frequency-modulated signal generated based on at least one triangular wave, the upper limit frequency of a frequency-modulated signal generated by at least one other triangular wave is higher, the frequency intervals between the frequency-modulated signals can be reduced.

Figure 24:
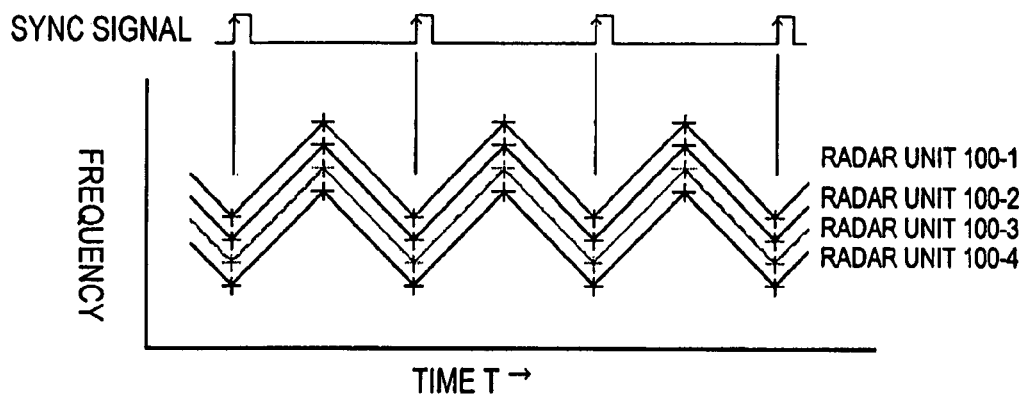
FIG. 24 shows frequency changes of frequency-modulated transmission signals in each of the oscillators 101.

At this time, as shown in FIG. 24, frequencies can be set such that, for the lower limit frequency of one frequency-modulated signal, the upper limit frequencies of all the other frequency-modulated signals (one (that with the closest center frequency), two (those with the two closest center frequencies), or more) transmitted as multi-radar signals are higher.

FIG. 24 shows frequency changes in frequency-modulated transmission signals in each of the oscillators 101. The frequency changes of the triangular waves for each transmission signal are synchronized with the sync signal, so that the frequencies of the transmission signals change synchronously. That is, the each timing point of the upper limit frequency and lower limit frequency due to frequency modulation of the transmission signals coincide. The directions of frequency increase and decrease also coincide.

Further, in the frequency domain in FIG. 24, the center frequency of each of the oscillators 101 is allocated by shifting by a prescribed frequency interval (channel interval), and by controlling the control voltage Vcont such that the frequency deviation amount for the modulating triangular waves of each radar unit is constant, the rates of frequency increase/decrease coincide, and frequency intervals are always constant regardless of the timing.

Hence even in cases in which the lower limit frequency of the transmission signal with higher center frequency among a pair of adjacent transmission signals is lower than the upper limit frequency of the transmission signal with lower center frequency, which in the prior art would pose problems, there is no overlap of transmission signal frequencies, and no interference occurs. For example, the lower limit frequency of the transmission signal of oscillator 101-1 is lower than the upper limit frequency of the transmission signal of the adjacent oscillator 101-2, but there is no timing overlap, and there is no interference between the transmission signal of oscillator 101-1 and the transmission signal of oscillator 101-2. Similarly, there is no interference between other pairs of transmission signals.

In the multi-radar system of this aspect of the invention, frequency modulation is performed using synchronized triangular waves, and by causing modulation frequency deviation amounts to correspond, prescribed frequency intervals (channel intervals) can be set for channels which do not depend on the frequency deviation amounts.

That is, a greater number of channels can be set in a restricted frequency band without changing the frequency deviation amounts of transmission signals, and more effective use of the frequency band can be made. In this specification, a frequency to which the transmission signal of a deployed radar unit has been allocated may be called a "channel".

Channel intervals are determined taking into account the parameters indicated in Table 1.

TABLE 1

| Item | Parameter | Symbol | Specifications | Notes |
|------|-----------|--------|----------------|-------|
| 1 | Frequency band | — | 76 GHz~77 GHz | 1 GHz Bandwidth |
| 2 | Reference signal Stability | — | ±10 ppm | ⇒ ±0.76 MHz |
| 3 | PLL steady-state frequency error due to DAC quantization error (VCO range * Vcont range/DAC resolution) | — | ±0.78 MHz | Vcont range: 0-10 V VCO range: 4 × $\Delta f$ DAC resolution: 1024 |
| 4 | Frequency deviation | $\Delta f$ | 200 MHz | |
| 5 | Frequency deviation calibration error | — | ±1% | ⇒ ±2 MHz |
| 6 | Detectable relative velocities | V | ±160 km/h Max. | |
| 7 | Doppler shift deviation | 2foV/c | ±22.5 KHz | @ V = ±160 km/h |
| 8 | Detectable distance | L | 120 m Max. | |
| 9 | Triangular wave Frequency | 1/T | 500 Hz | |
| 10 | Delay time | Td = 2L/c | 800 ns | @ L = 120 m |
| 11 | Frequency deviation due to Delay | 2$\Delta f$/T * Td | ±160 KHz | @ L = 120 m |

$c = 3 \times 10^8$ (m/s)

Specifically, when the usable frequency band is from 76 GHz to 77 GHz, for a bandwidth of 1 GHz (item 1), the stability of the reference signal (item 2), which is the frequency error of the transmission signal for each radar unit, the steady-state frequency error of the PLL circuit (item 3), the frequency deviation calibration error (item 5), Doppler shift deviation (item 7), frequency displacement due to round-trip time (item 11), and other parameters are considered, and twice the value of the sum of these frequency change amounts (because the various change amounts occur in the upward and downward directions from the center frequency) become the required channel interval. In the example of Table 1, this is twice the value of the sum (3.7225 MHz) of the change amounts of items 2, 3, 5, 7, and 11, that is, approximately 7.45 MHz.

The frequency deviation amount is set to 200 MHz (item 4), and so in the frequency band from 76 GHz to 77 GHz, the band in which a center frequency can be set is the 600 MHz band from 76.2 GHz to 76.8 GHz; if the channel interval is 7.45 MHz, then in this band 81 channels can be set.

Figure 25:
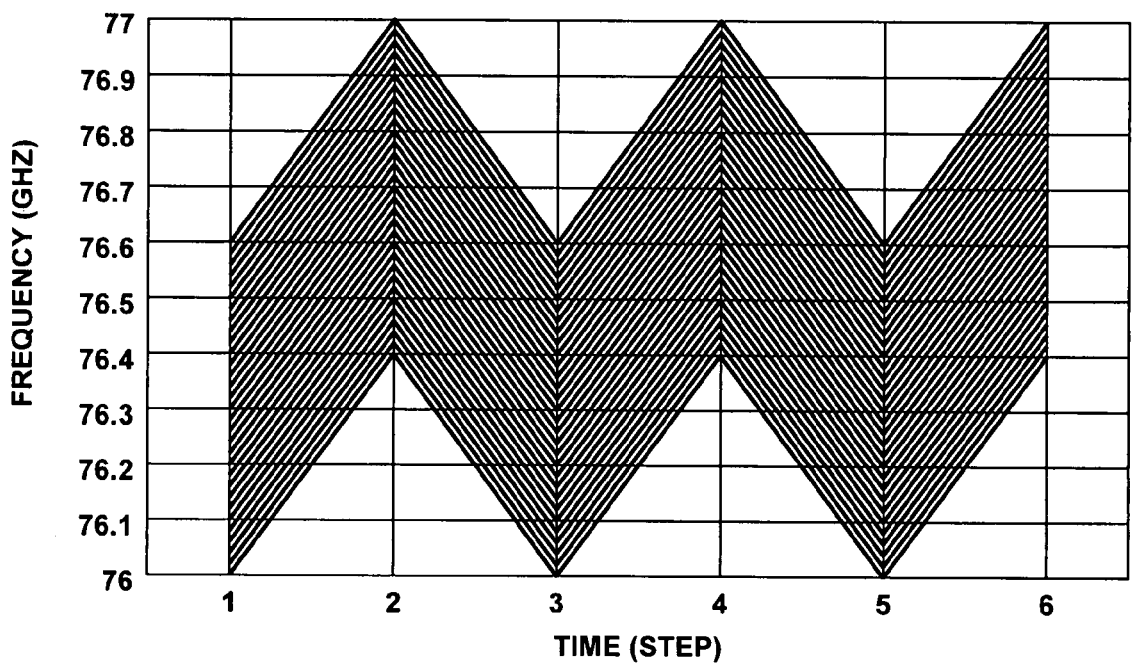
FIG. 25 shows an example in which 81 channels are set in the frequency band from 76 GHz to 77 GHz.

FIG. 25 shows an example in which 81 channels are set in the frequency band from 76 GHz to 77 GHz. In the case of the prior art shown in FIG. 22C, when the bandwidth is 1 GHz and the frequency deviation is 200 MHz, only two channels can be set; but in an aspect of this invention, under substantially the same conditions 81 channels can be set, so that the number of channels can be increased dramatically.

FIG. 26 is a figure showing in summary an example of the configuration of the multi-radar system of an eighth aspect. The multi-radar system of the eighth aspect is a modified example of the seventh aspect in FIG. 20, and shows a case in which a sync signal is supplied from an external device. Specifically, a sync signal having the period of the triangular wave is for example radiated from an external radio wave emission source using AM broadcast or FM broadcast radio waves. A receiver 110 of the multi-radar system receives this radio wave, and supplies the sync signal with prescribed frequency comprised by the radio wave to each of the radar units 100-1 to 100-4. As indicated in the figure, the sync signal may be supplied to each of the slave radar units 100-2 to 100-4 via the master radar unit 100-1, or may be supplied from the receiver 110 in parallel to master radar units 100-1 to 100-4. Or, each radar unit 100 may comprise a receiver 110, so that each radar unit receives the sync signal. By supplying the sync signal from an external device, the difference in sync signals due to sync signals generated by each of the individual master radar units themselves is eliminated, and triangular waves can be synchronized even among a plurality of multi-radar systems.

In particular, when at least one radar unit is mounted in each of a plurality of vehicles, and a multi-radar system is configured, a receiver 110 is installed in each vehicle, and the radar unit in each vehicle outputs a triangular wave based on the sync signal received by the receiver 110. By this means, the triangular waves of radar units in a multi-radar system comprising a plurality of radar units at a distance can also be synchronized by a triangular wave. Installation of car navigation systems employing GPS technology has become widespread, and it has become easy to obtain GPS signals by a vehicle. Such GPS signals can for example use as sync signals the 1 PPS signals output at one second intervals. In this case, the 1 PPS signals are single-pulse signals output at one second intervals, and so when the frequency of the triangular wave is 100 Hz, when a 1 PPS signal is input, it is sufficient to output 100 pulses of the triangular wave.

FIG. 27 shows an example of the configuration of the oscillator 101 in each radar unit in the multi-radar system of the ninth aspect. The multi-radar system of the ninth aspect is a modified example of the seventh aspect in FIG. 22, showing a case in which the reference signal is used in common by the radar units. Specifically, the clock oscillator 1 which generates the reference signal is used in common by the oscillators of each of the radar units. By this means, there is no need to take into consideration the frequency deviation (item 2 in Table 1) of the reference signal, and moreover, the channel frequency intervals can be decreased. Specifically, in the case of Table 1, an interval of approximately 7.45 MHz can be reduced to approximately 5.93 MHz ((3.7225 MHz−0.76 MHz)×2=5.9225 MHz).

Figure 28:
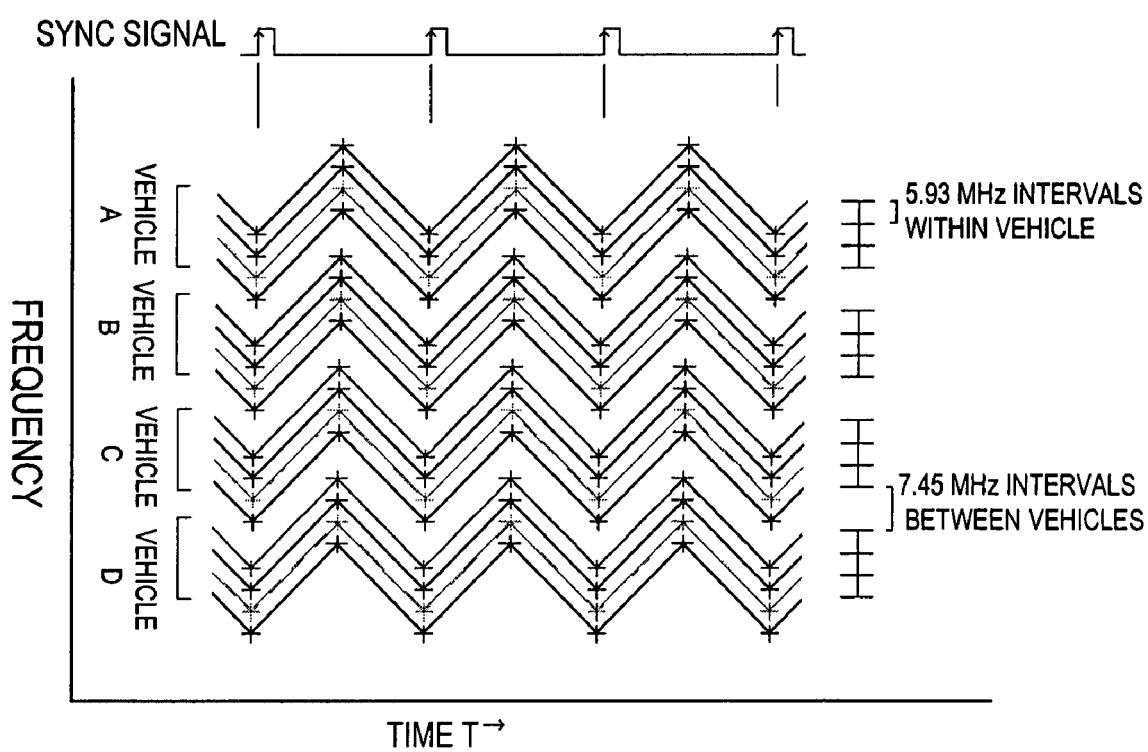
FIG. 28 shows an example of frequency allocation of transmission signals for each radar unit in the multi-radar system of the ninth aspect.

FIG. 28 shows an example of transmission signal frequency allocation for each radar unit in the multi-radar system of the ninth aspect. In FIG. 28, a case is shown as an example in which four radar units are mounted in each of four vehicles A, B, C, and D; by using in common the clock oscillator 1 for four radar units in each vehicle, the frequency intervals within each vehicle can be set to 5.93 MHz, and the frequency intervals between vehicles can be set to approximately 7.45 MHz.

Figure 29:
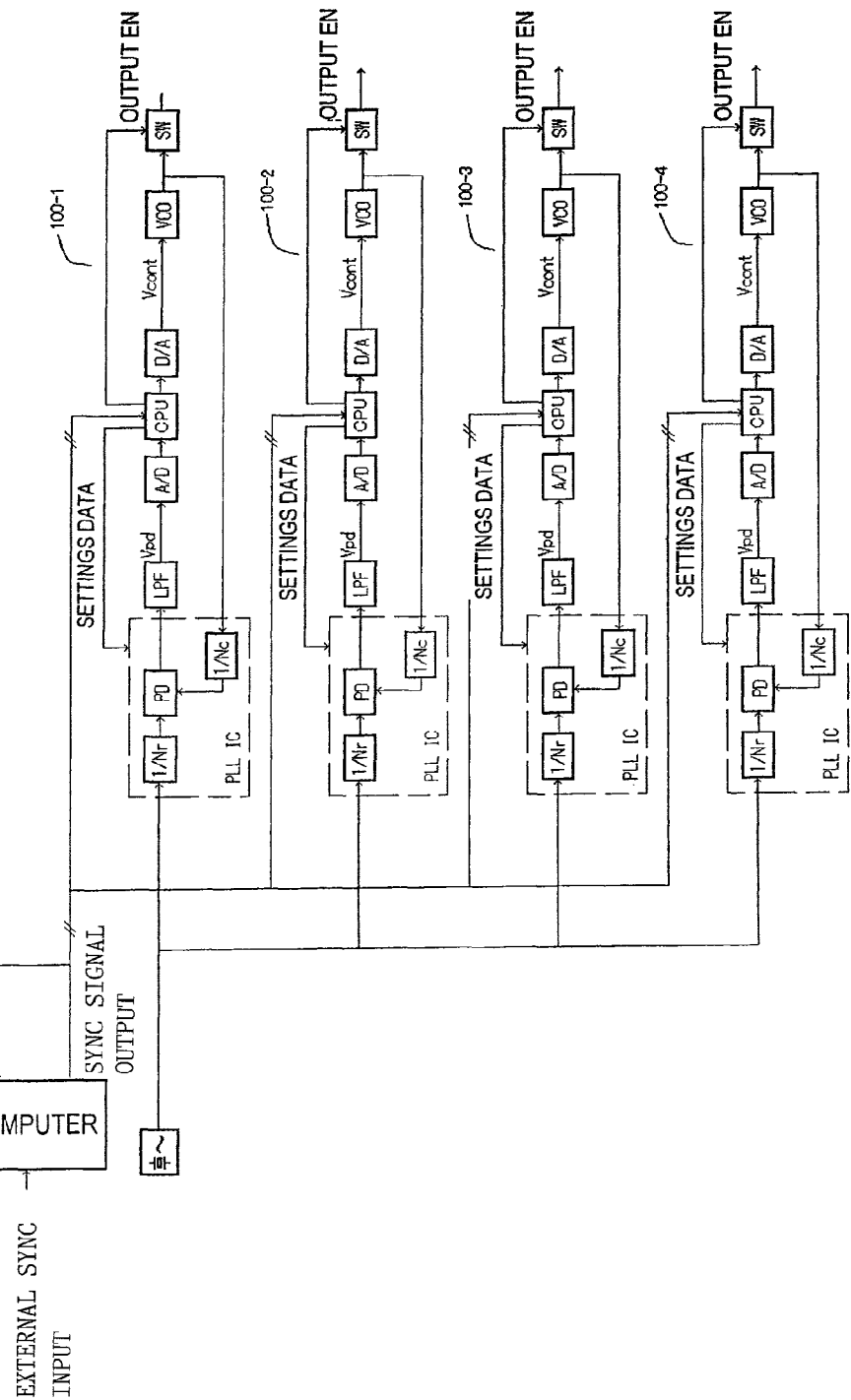
FIG. 29 shows an example of the configuration of the oscillator 101 in each radar unit of the multi-radar system of a tenth aspect.

FIG. 29 shows an example of the configuration of the oscillator 101 in each of the radar units of the multi-radar system of a tenth aspect. The multi-radar system of the tenth aspect is a modified example of the seventh aspect in FIG. 22; the distinction between master radar unit and slave radar units is eliminated, and a sync signal controller (sync signal generation means) 111 which generates and outputs a sync signal independently of the CPUs 15 is provided. The sync signal generated by the sync signal controller 111 is supplied to each of the radar units 100-1 to 100-4. In addition, the sync signal controller 111 executes unified detection of anomalies and malfunctions relating to the sync signal, such as the halting of input of the sync signal.

FIG. 30 shows an application example in which channel frequency bands are divided according to the direction of advance of the vehicle. In a case in which a multi-radar system of an aspect of the invention is applied to automobiles, when two vehicles pass each other, if the channels allocated to the radar of each vehicle are the same, then each vehicle receives transmission signals from the radar of the other, and correct measurement cannot be performed. Hence as one example, the frequency band is divided into an uptown-direction band and a downtown-direction band, as shown in FIG. 30, with the band channels allocated corresponding to the direction of vehicle advance. The direction of vehicle advance is for example acquired using direction information detected by a GPS system mounted on the vehicle. The uptown-direction band channel is allocated to a vehicle advancing in the uptown direction, and the downtown-direction band channel is allocated to a vehicle advancing in the downtown direction. By this means, the channels of two vehicles, which pass each other, will not be the same. In a case in which the same channel is allocated to two vehicles advancing in the same direction, the possibility of mutual approach to an extent that there would be mutual interference of radio waves from the radar mounted on each vehicle is small compared with the possibility of vehicles passing in opposite directions. Hence the frequency band in which channels are allocated is divided, as shown in FIG. 30, such that channels are different for different vehicle directions of advance, and in cases where there is a high possibility of two vehicles approaching, as for example when passing in opposite directions, channels are allocated in different frequency bands according to the direction of vehicle advance; in cases where there is a low possibility of two vehicles approaching each other, a plurality of vehicles can effectively use the same channel.

FIG. 31 shows another application example in which the channel frequency band is divided according to the direction of vehicle advance. FIG. 31 is an example of division not for two directions as in FIG. 30, but for four directions; the frequency band is divided for four directions, such as for example north, south, east and west, and channels are allocated in different frequency bands according to the direction of vehicle advance. The number of directions for division is not limited to two or four directions, and further division, for example for eight directions, is possible.

The radar units comprised by the multi-radar system of an aspect of the invention are not limited to FM-CW radar. For example, each radar unit may employ two-frequency CW radar; in the case of two-frequency CW radar, the two frequencies allocated to each radar unit are different for each radar unit, and by causing the timing of frequency switching to coincide for each radar unit, interference between transmission signals can be suppressed.

Figure 32A:
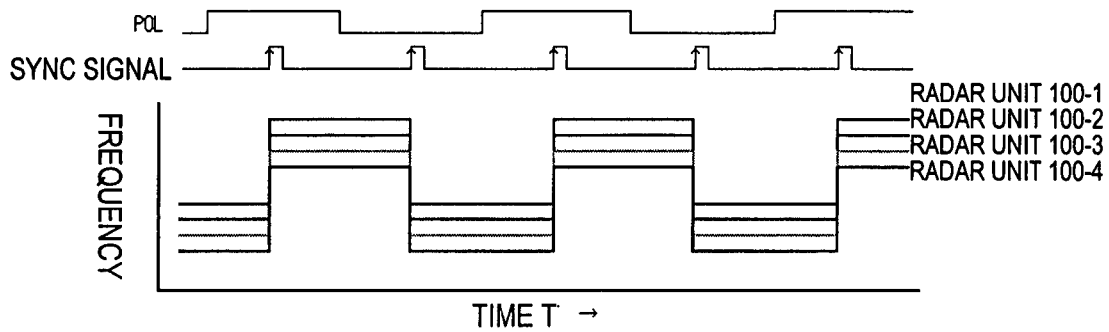
FIG. 32A-32C show examples of frequency allocation in a multi-radar system employing two-frequency CW radar.
Figure 32B:
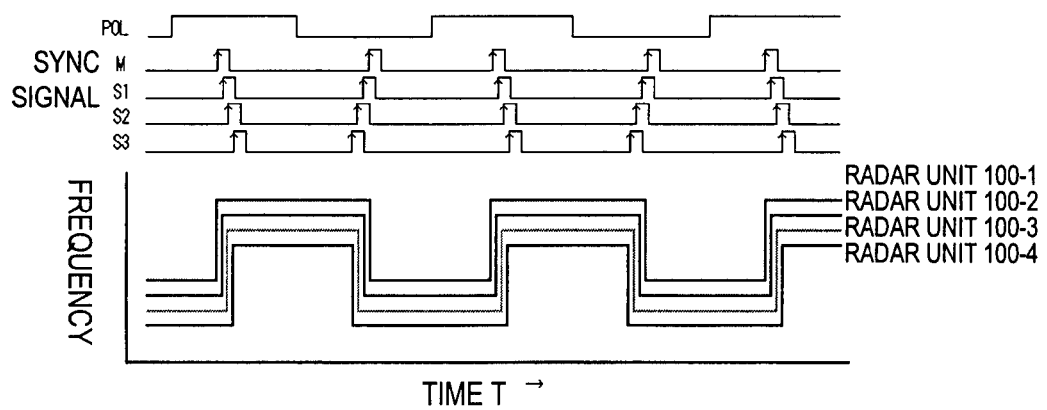
Figure 32C:
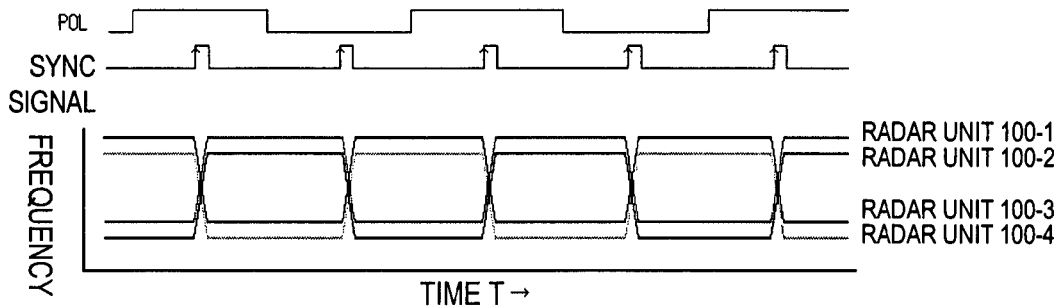

FIG. 32A-32C show examples of frequency allocation in a multi-radar system using two-frequency CW radar. Below, two-frequency CW radar is also simply referred to as "radar", and reference number 100 is used. In FIG. 32A, the timing of transmission signal frequency switching is made to coincide for each radar unit. By this means, frequencies allocated to radar units 100 do not overlap even when within a band of two frequencies allocated to other radar units. In frequency switching timing, frequencies of radar units may overlap momentarily, but the signals for switching timing are masked, and are not subjected to signal processing. FIG. 32B is an example of frequency allocation in which interference does not occur even at the timing of frequency switching. The switching timing is shifted for each radar unit such that frequencies do not overlap. By this means, mask processing timed to frequency switching is not necessary. And, FIG. 32C is an example in which, in a plurality of radar units 100-1 to 100-4, the frequency switching direction of radar units 100-1 and 100-2 at the times of frequency switching is opposite the direction of frequency switching of radar units 100-3 and 100-4. By this means, the number of channels which can be allocated in the frequency band can be further increased, and the efficiency of frequency utilization is improved. Compared with FIGS. 32A and B, in which frequency switching occurs in the same direction, the number of channels can be increased by a maximum twofold.

Figure 33:
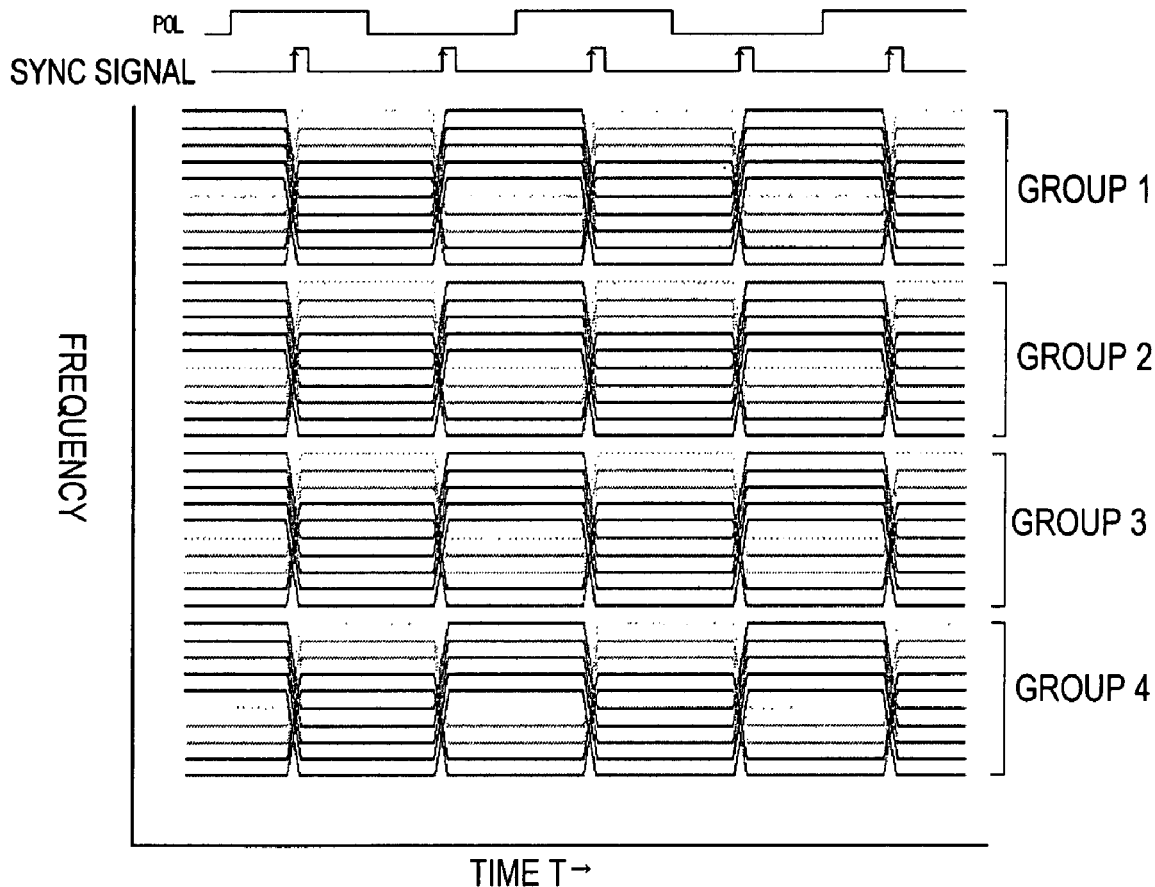
FIG. 33 shows an example of frequency ordering in a large-scale multi-radar system employing two-frequency CW radar.

FIG. 33 shows an example of the frequency ordering in a large-scale multi-radar system employing two-frequency CW radar. Frequency bands are divided into a plurality of groups, and in each group, the frequency ordering example shown in FIG. 32C is applied. That is, in each group a plurality of channels are set which have the same frequency switching timing but different directions of frequency switching.

Figure 34:
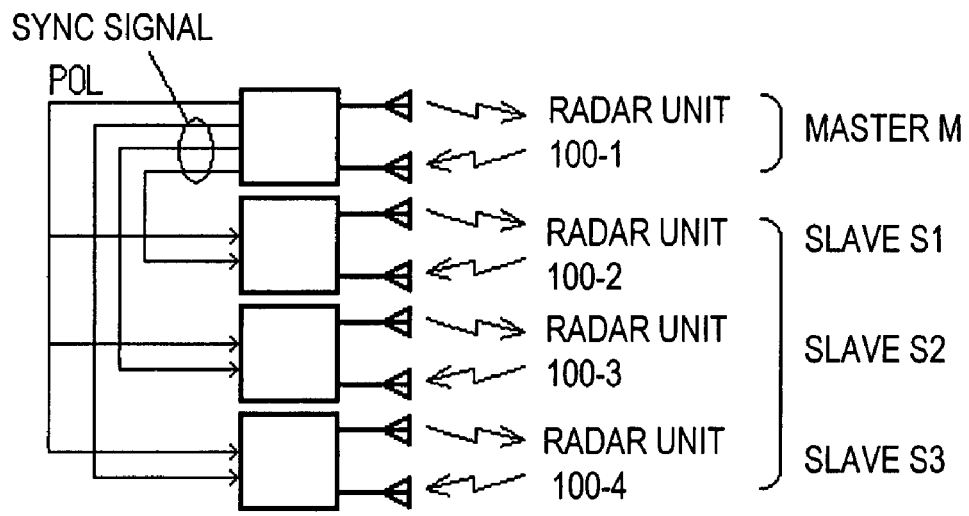
FIG. 34 shows in summary an example of the configuration of a multi-radar system employing two-frequency CW radar.
Figure 35A:
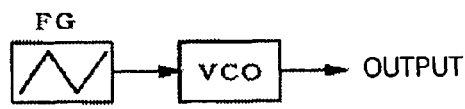
FIG. 35A-35C explain technology of the prior art.
Figure 35B:
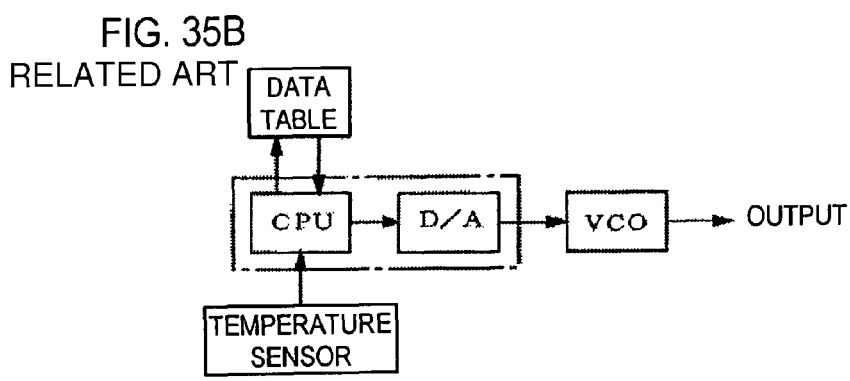
Figure 35C:
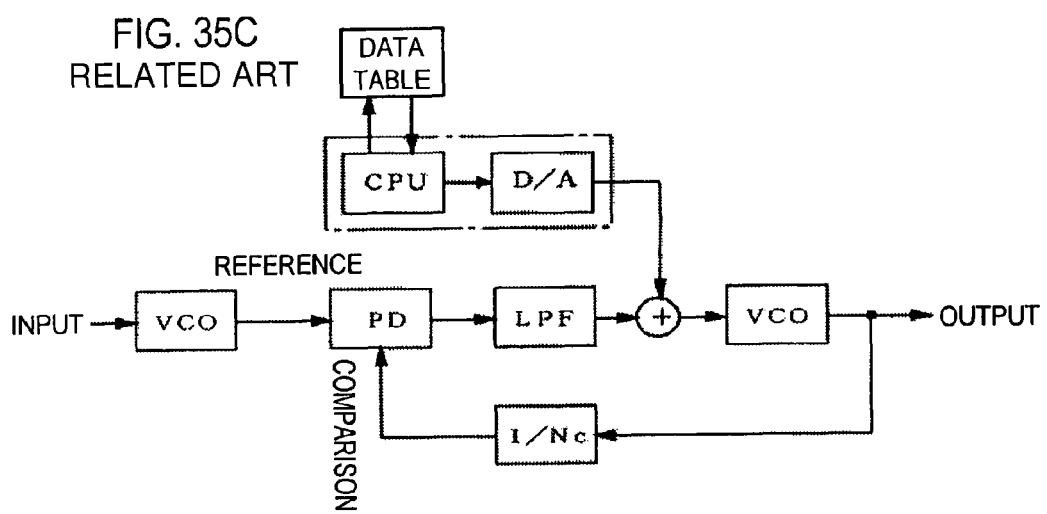
Figure 36A:
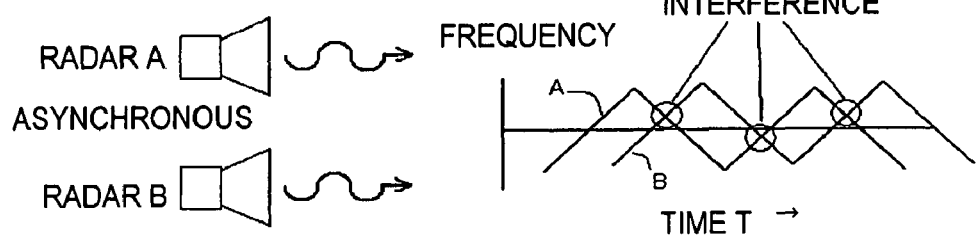
FIG. 36A-36B explain frequency allocation in each radar unit of a multi-radar system of the prior art.
Figure 36B:
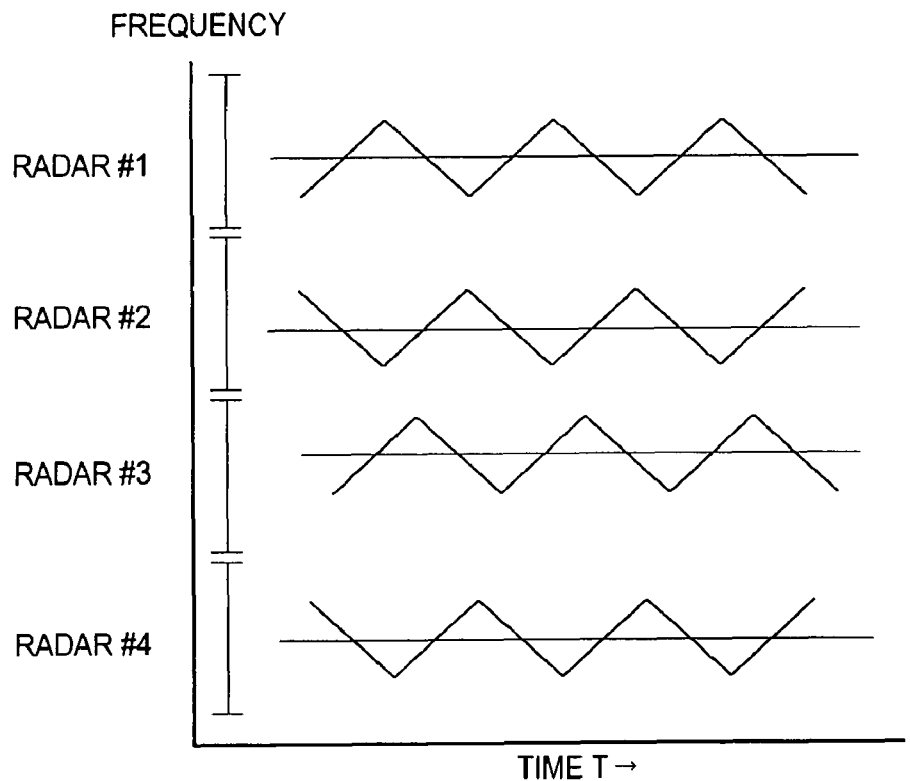
Figure 37A:
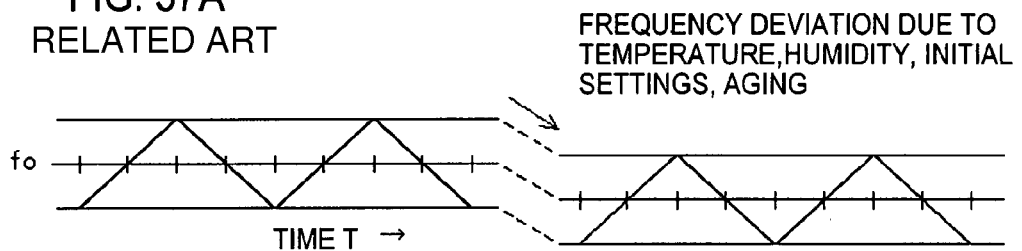
FIG. 37A-37C explain changes in the center frequency and frequency deviation of transmission signals.
Figure 37B:
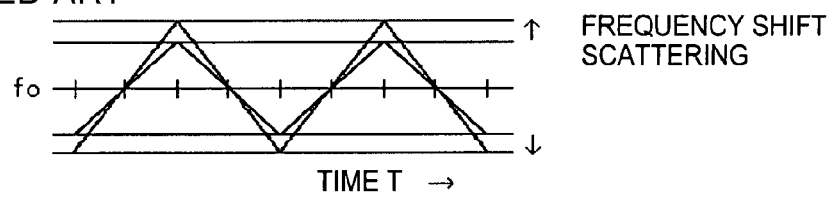
Figure 37C:
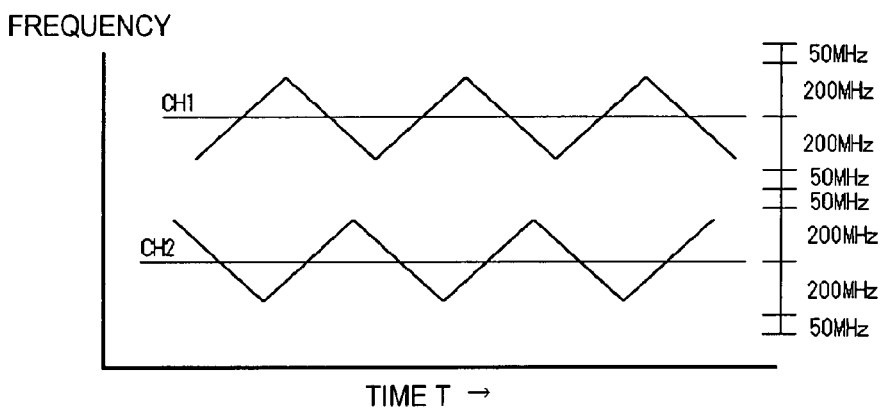

FIG. 34 shows in summary an example of the configuration of a multi-radar system using two-frequency CW radar. Similarly to the configuration example of FIG. 20, in the example of FIG. 34 a sync signal is output from the master radar unit to slave radar units with the timing of frequency switching; by switching frequencies in synchronization with the sync signal, the slave radar units can perform frequency switching in synchronization. Further, the master radar unit supplies a polarity signal POL, which determines the frequency switching direction, to the slave radar units. The polarity signal is a signal which changes between H and L levels with the frequency switching period; the frequency switching direction is determined according to the level of the polarity signal. For example, while an H-level polarity signal is being supplied, upon receiving a sync signal each slave radar unit switches to the higher frequency among the two frequencies, and while a L-level polarity signal is being supplied, upon receiving a sync signal each radar unit switches to the lower frequency. Similarly to aspects of FM-CW radar, the polarity signal and sync signal may be supplied from an external device, to be received by a master radar unit and supplied to the slave radar units; or a configuration may be employed in which there is no distinction between master radar and slave radar units, and all radar units receive the polarity signal and sync signal from an external device.

In the above, a plurality of preferred aspects of the invention have been described; but of course various modifications can be made to the configurations, control, processing, and combinations of each of the portions thereof, without deviating from the conceptual scope of the invention.

What is claimed is:

1. A phase-locked oscillator, comprising a PLL loop having a phase detector which compares the phases of a reference signal and a comparison signal, a low-pass filter which integrates a phase error signal of the phase detector, a controller which is interposed in a stage after the low-pass filter and which executes main control of the oscillator, a VCO circuit which generates a signal at a frequency according to a control voltage output from the controller, and a variable frequency divider which frequency-divides the output signal of the VCO circuit and forms the comparison signal, wherein the controller comprises:

control voltage measurement means for locking the PLL loop at a plurality of frequencies and for measuring the control voltage for each locking; and linearity calibration means for determining a VCO gain factor representing a frequency change between intervals connecting each of the frequencies, based on each of the measured control voltages;

VCO driving means for generating and outputting a voltage signal, after locking the PLL loop on a prescribed frequency, and with the PLL loop in the open state, to cause a linearity-corrected periodic frequency change centered on the prescribed frequency in the VCO circuit, based on the determined VCO gain factor;

wherein the VCO driving means samples the output of the low-pass filter in synchronization with the timing of output of the center frequency by the VCO circuit, and when a detected phase error signal exceeds a prescribed range, offsets the control voltage in the direction to reduce the phase error signal.

2. A phase-locked oscillator, comprising a PLL loop having a phase detector which compares the phases of a reference signal and a comparison signal, a low-pass filter which integrates a phase error signal of the phase detector, a controller which is interposed in a stage after the low-pass filter and which executes main control of the oscillator, a VCO circuit which generates a signal at a frequency according to a control voltage output from the controller, and a variable frequency divider which frequency-divides the output signal of the VCO circuit and forms the comparison signal, wherein the controller comprises:

control voltage measurement means for changing the PLL lock frequency at prescribed intervals, and measuring the control voltage for each locking over a range covering a prescribed frequency range;

linearity calibration means for dividing the range of change of the measured control voltages into a plurality of intervals, and determining a VCO gain factor representing each interval; and, VCO driving means, with the PLL loop in an open state after locking the PLL loop on a prescribed frequency, for generating and outputting a voltage signal to cause a linearity-corrected periodic frequency change centered on the prescribed frequency in the VCO circuit, based on the control voltage during locking and on the determined VCO gain factor representing each interval;

wherein the VCO driving means samples the output of the low-pass filter in synchronization with the timing of output of the center frequency by the VCO circuit, and when a detected phase error signal exceeds a prescribed range, offsets the control voltage in the direction to reduce the phase error signal.

3. A multi-radar system configured comprising a plurality of FM-CW radar units having a phase-locked oscillator, comprising a PLL loop having a phase detector which compares the phases of a reference signal and a comparison signal, a low-pass filter which integrates a phase error signal of the phase detector, a controller which is interposed in a stage after the low-pass filter and which executes main control of the oscillator, a VCO circuit which generates a signal at a frequency according to a control voltage output from the controller, and a variable frequency divider which frequency-divides the output signal of the VCO circuit and forms the comparison signal, wherein the controller comprises:

control voltage measurement means for locking the PLL loop at a plurality of frequencies and for measuring the control voltage for each locking; and linearity calibration means for determining a VCO gain factor representing a frequency change between intervals connecting each of the frequencies, based on each of the measured control voltages;

VCO driving means for generating and outputting a voltage signal, after locking the PLL loop on a prescribed frequency, and with the PLL loop in the open state, to cause a linearity-corrected frequency change centered on the prescribed frequency in the VCO circuit, based on the determined VCO gain factor;

wherein the VCO driving means samples the output of the low-pass filter in synchronization with the timing of output of the center frequency by the VCO circuit, and when a detected phase error signal exceeds a prescribed range, offsets the control voltage in the direction to reduce the phase error signal;

wherein the controller of each FM-CW radar unit generates the control voltage, which increases and decreases periodically, and is synchronized with a prescribed sync signal such that the increase/decrease direction and the increase/decrease rate of the control voltages are coincident, and the VCO circuit of each FM-CW radar unit outputs a signal according to the increase and decrease in the control voltage, with a prescribed frequency deviation amount frequency with respect to a center frequency of the signal increasing and decreasing periodically such that the center frequencies are different for each signal and such that the direction of increase/decrease and the increase/decrease rate of the signals are coincident.

4. The multi-radar system according to claim 3, wherein one among the controllers of the FM-CW radar units generates the sync signal and outputs the signal to the other controllers.

5. The multi-radar system according to claim 3, wherein one among the controllers of the FM-CW radar units receives a sync signal supplied from an external device and outputs the signal to the other controllers.

6. The multi-radar system according to claim 3, wherein the controllers of each of the FM-CW radar units receives a sync signal supplied from an external device.

7. The multi-radar system according to claim 3, wherein the reference signal is common to all FM-CW radar units.

8. The multi-radar system according to claim 3, comprising sync signal generation means for generating the sync signal, wherein the sync signal generated by the sync signal generation means is supplied to each controller.

9. A multi-radar system configured comprising a plurality of FM-CW radar units having a phase-locked oscillator, comprising a PLL loop having a phase detector which compares the phases of a reference signal and a comparison signal, a low-pass filter which integrates a phase error signal of the phase detector, a controller which is interposed in a stage after the low-pass filter and which executes main control of the oscillator, a VCO circuit which generates a signal at a frequency according to a control voltage output from the controller, and a variable frequency divider which frequency-divides the output signal of the VCO circuit and forms the comparison signal, wherein the controller comprises:

control voltage measurement means for locking the PLL loop at a plurality of frequencies and for measuring the control voltage for each locking; and linearity calibration means for determining a VCO gain factor representing a frequency change between intervals connecting each of the frequencies, based on each of the measured control voltages;

VCO driving means for generating and outputting a voltage signal, after locking the PLL loop on a prescribed frequency, and with the PLL loop in the open state, to cause a linearity-corrected frequency change centered on the prescribed frequency in the VCO circuit, based on the determined VCO gain factor;

wherein the VCO driving means samples the output of the low-pass filter in synchronization with the timing of output of the center frequency by the VCO circuit, and when a detected phase error signal exceeds a prescribed range, offsets the control voltage in the direction to reduce the phase error signal;

wherein:

the controller of each FM-CW radar unit generates the control voltage, which increases and decreases periodically, and is synchronized with a predetermined sync signal such that the increase/decrease direction and the increase/decrease rate of the control voltage are coincident; and the VCO circuit of each FM-CW radar units outputs a signal according to the increase and decrease in the control voltage, such that the upper limit and the lower limit of the frequency which periodically increases and decreases is different of each signal of each FM-CW radar unit, and the timing of the upper limit and lower limit substantially coincides among the signals.

10. The multi-radar system according to claim 9, wherein the VCO circuit of each FM-CW radar unit generates the signal in synchronization with a prescribed sync signal such that the direction of increase and decrease and the rate of increase and decrease of the frequency of the signal coincide.

11. The multi-radar system according to claim 9, wherein one among the controllers of the FM-CW radar units generates the sync signal and outputs the signal to the other radar units.

12. The multi-radar system according to claim 9, wherein one among the controllers of the FM-CW radar units receives a sync signal supplied from an external device and outputs the signal to the other radar units.

13. The multi-radar system according to claim 9, wherein the controllers of each of the FM-CW radar units receive a sync signal supplied from an external device.

14. The multi-radar system according to claim 13, wherein the plurality of radar units are installed respectively on a plurality of vehicles, and the radar unit installed on the vehicle advancing in a first direction generates a signal at a frequency included in a first frequency band, and the radar unit installed on the vehicle advancing in a second direction different from the first direction generates a signal at a frequency included in a second frequency band different from the first frequency band.

15. A multi-radar system, comprising:
a triangular wave generator which generates a plurality of synchronized triangular waves; and a plurality of voltage-controlled oscillators which respectively take the plurality of triangular waves as control signals and output frequency-modulated signals according to the respective control signals, wherein the plurality of voltage-controlled oscillators output frequency-modulated signals the center frequencies of which are different, and the output frequencies of which are set such that, relative to the lower limit frequency of the frequency-modulated signal generated based on at least one triangular wave, the upper limit frequency of the frequency-modulated signal generated based on at least one other triangular wave is larger.

16. A method of operating a phase-locked oscillator comprising a PLL loop having a phase detector which compares the phases of a reference signal and a comparison signal, a low-pass filter which integrates a phase error signal of the phase detector, a controller which is interposed in a stage after the low-pass filter and which executes main control of the oscillator, a VCO circuit which generates a signal at a frequency according to a control voltage output from the controller, and a variable frequency divider which frequency-divides the output signal of the VCO circuit and forms the comparison signal, wherein the method comprises:

locking the PLL loop at a plurality of frequencies and measuring the control voltage for each locking; and determining a VCO gain factor representing a frequency change between intervals connecting each of the frequencies, based on each of the measured control voltages;

generating and outputting a voltage signal, after locking the PLL loop on a prescribed frequency, and with the PLL loop in the open state, to cause a linearity-corrected periodic frequency change centered on the prescribed frequency in the VCO circuit, based on the determined VCO gain factor; and sampling the output of the low-pass filter in synchronization with the timing of output of the center frequency by the VCO circuit, and when a detected phase error signal exceeds a prescribed range, offsetting the control voltage in the direction to reduce the phase error signal.

17. A method of operating a phase-locked oscillator comprising a PLL loop having a phase detector which compares the phases of a reference signal and a comparison signal, a low-pass filter which integrates a phase error signal of the phase detector, a controller which is interposed in a stage after the low-pass filter and which executes main control of the oscillator, a VCO circuit which generates a signal at a frequency according to a control voltage output from the controller, and a variable frequency divider which frequency-divides the output signal of the VCO circuit and forms the comparison signal, wherein the method comprises:

changing the PLL lock frequency at prescribed intervals, and measuring the control voltage for each locking over a range covering a prescribed frequency range;

dividing the range of change of the measured control voltages into a plurality of intervals, and determining a VCO gain factor representing each interval; and, generating and outputting a voltage signal with the PLL loop in an open state after locking the PLL loop on a prescribed frequency, to cause a linearity-corrected periodic frequency change centered on the prescribed frequency in the VCO circuit, based on the control voltage during locking and on the determined VCO gain factor representing each interval; and sampling the output of the low-pass filter in synchronization with the timing of output of the center frequency by the VCO circuit, and when a detected phase error signal exceeds a prescribed range, offsetting the control voltage in the direction to reduce the phase error signal.

\* \* \* \* \*